(12) United States Patent
Huang

(10) Patent No.: US 11,398,419 B2
(45) Date of Patent: Jul. 26, 2022

(54) WIRING STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/931,362

(22) Filed: Jul. 16, 2020

(65) Prior Publication Data

US 2022/0020674 A1 Jan. 20, 2022

(51) Int. Cl.
*H01L 21/48* (2006.01)
*H01L 23/498* (2006.01)

(52) U.S. Cl.
CPC ...... *H01L 23/49822* (2013.01); *H01L 21/486* (2013.01); *H01L 21/4857* (2013.01); *H01L 23/49833* (2013.01)

(58) Field of Classification Search
CPC ............ H05K 1/115; H05K 2201/096; H05K 2201/09827; H05K 2201/09845; H05K 2201/09854; H05K 3/4647; H05K 3/4038; H01L 23/49822; H01L 23/49833; H01L 21/4857; H01L 21/486
See application file for complete search history.

(56) References Cited

U.S. PATENT DOCUMENTS

| | | | | |
|---|---|---|---|---|
| 5,227,013 | A * | 7/1993 | Kumar | H01L 21/486 216/18 |
| 6,590,165 | B1* | 7/2003 | Takada | H05K 3/0035 174/266 |
| 2006/0083895 | A1* | 4/2006 | Ikeda | B32B 7/02 428/137 |
| 2010/0295191 | A1* | 11/2010 | Kikuchi | H01L 23/49838 257/784 |
| 2011/0147059 | A1* | 6/2011 | Ma | H01L 24/17 174/258 |
| 2015/0053460 | A1* | 2/2015 | Kunimoto | H05K 3/4602 174/251 |
| 2019/0098752 | A1* | 3/2019 | Sakamoto | H05K 3/4644 |
| 2020/0035575 | A1* | 1/2020 | Sunada | H05K 3/429 |

* cited by examiner

*Primary Examiner* — Roshn K Varghese
(74) *Attorney, Agent, or Firm* — Foley & Lardner LLP

(57) ABSTRACT

A wiring structure and a method for manufacturing the same are provided. The wiring structure includes a conductive structure and at least one conductive through via. The conductive structure includes a plurality of dielectric layers and a plurality of circuit layers in contact with the dielectric layers. The conductive through via extends through the conductive structure. The conductive through via is a monolithic structure, and includes a main portion and an extending portion protruding from the main portion.

16 Claims, 42 Drawing Sheets

WIRING STRUCTURE AND METHOD FOR MANUFACTURING THE SAME

BACKGROUND

1. Field of the Disclosure

The present disclosure relates to a wiring structure and a manufacturing method, and to a wiring structure including at least one conductive through via, and a method for manufacturing the same.

2. Description of the Related Art

Along with the rapid development in electronics industry and the progress of semiconductor processing technologies, semiconductor chips are integrated with an increasing number of electronic components to achieve improved electrical performance and additional functions. Accordingly, the semiconductor chips are provided with more input/output (I/O) connections. To manufacture semiconductor packages including semiconductor chips with an increased number of I/O connections, circuit layers of semiconductor substrates used for carrying the semiconductor chips may correspondingly increase in size. Thus, a thickness and a warpage of the semiconductor substrate may correspondingly increase, and a yield of the semiconductor substrate may decrease.

SUMMARY

In some embodiments, a wiring structure includes a conductive structure and at least one conductive through via. The conductive structure includes a plurality of dielectric layers and a plurality of circuit layers in contact with the dielectric layers. The conductive through via extends through the conductive structure. The conductive through via is a monolithic structure, and includes a main portion and an extending portion protruding from the main portion.

In some embodiments, a wiring structure includes a lower conductive structure, an upper conductive structure and at least one conductive through via. The lower conductive structure includes at least one dielectric layer and at least one circuit layer in contact with the dielectric layer. The upper conductive structure is disposed on the lower conductive structure. The upper conductive structure includes a plurality of dielectric layers and a plurality of circuit layers in contact with the dielectric layers. The conductive through via extends through the upper conductive structure. The conductive through via is a monolithic structure, and includes a main portion and an extending portion protruding from the main portion. The conductive through via electrically connects the circuit layer of the lower conductive structure.

In some embodiments, a method for manufacturing a wiring structure includes: (a) attaching an upper conductive structure to a lower conductive structure, wherein the lower conductive structure includes at least one dielectric layer and at least one circuit layer in contact with the dielectric layer, and the upper conductive structure includes a plurality of dielectric layers, a plurality of circuit layers in contact with the dielectric layers, and a plurality of stacking portions connecting one another; (b) removing the stacking portions to form at least one accommodating hole; and (c) forming at least one conductive through via in the accommodating hole to extend through the upper conductive structure and contact the circuit layer of the lower conductive structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
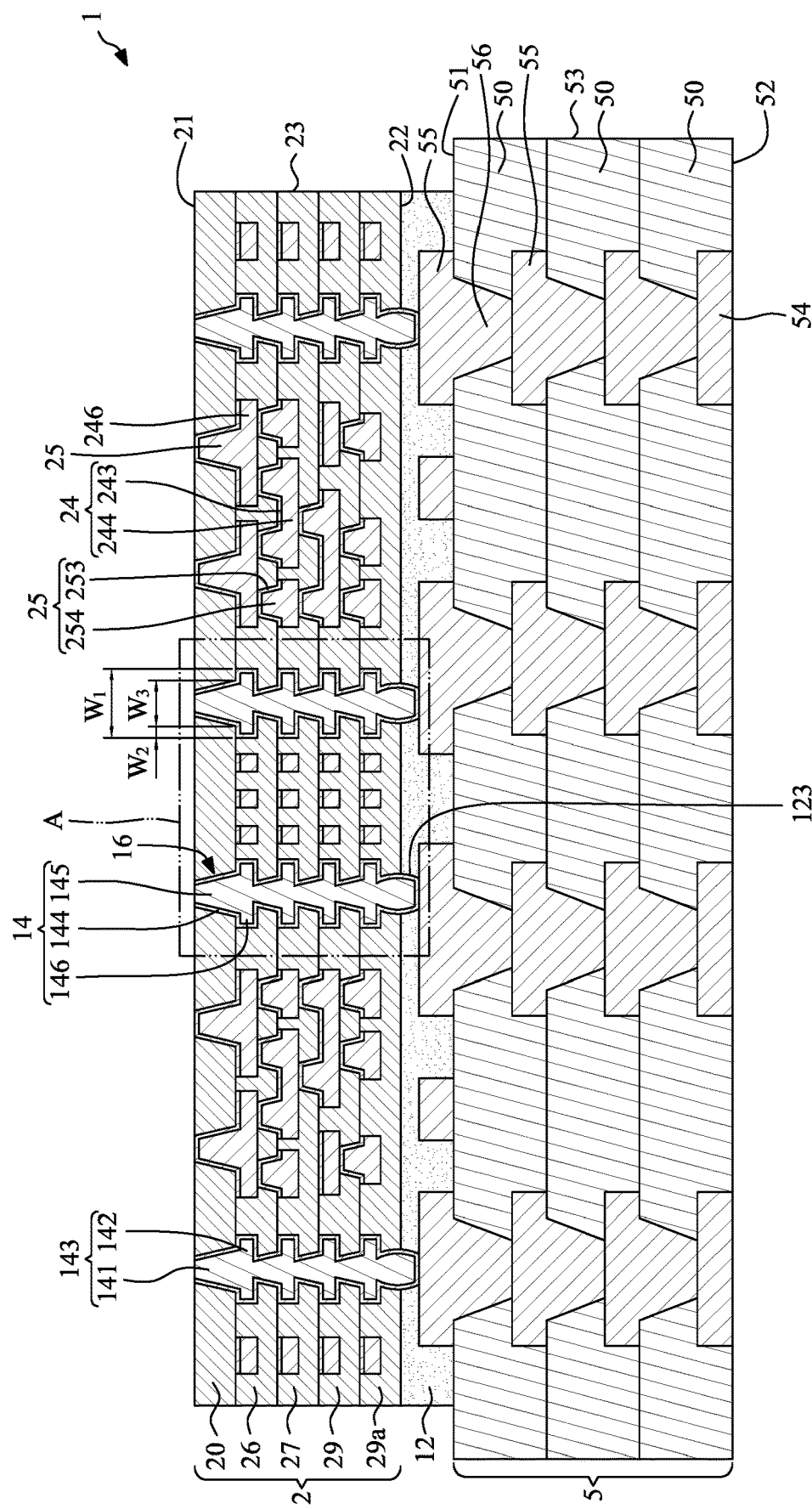
FIG. 1 illustrates a cross-sectional view of a wiring structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is low, the manufacturing yield for the circuit layers and the dielectric layers of such core substrate is also low, and, thus, the yield of such core substrate is low. In addition, each dielectric layer is relatively thick, and, thus, such core substrate is relatively thick. In some comparative embodiments, if a package has 10000 I/O counts, such core substrate may include twelve layers of circuit layers and dielectric layers. The manufacturing yield for one layer (including one circuit layer and one dielectric layer) of such core substrate may be 90%. Thus, the yield of such core substrate may be $(0.9)^{12}=28.24\%$. In addition, warpage of the twelve layers of circuit layers and dielectric layers may be accumulated, and, thus, the top several layers may have severe warpage. As a result, the yield of such core substrate may be further reduced.

At least some embodiments of the present disclosure provide for a wiring structure which has an advantageous compromise of yield and manufacturing cost. In some embodiments, the wiring structure includes an upper conductive structure and a lower conductive structure bonded to the upper conductive structure through an intermediate layer. At least some embodiments of the present disclosure further provide for techniques for manufacturing the wiring structure.

Figure 2:
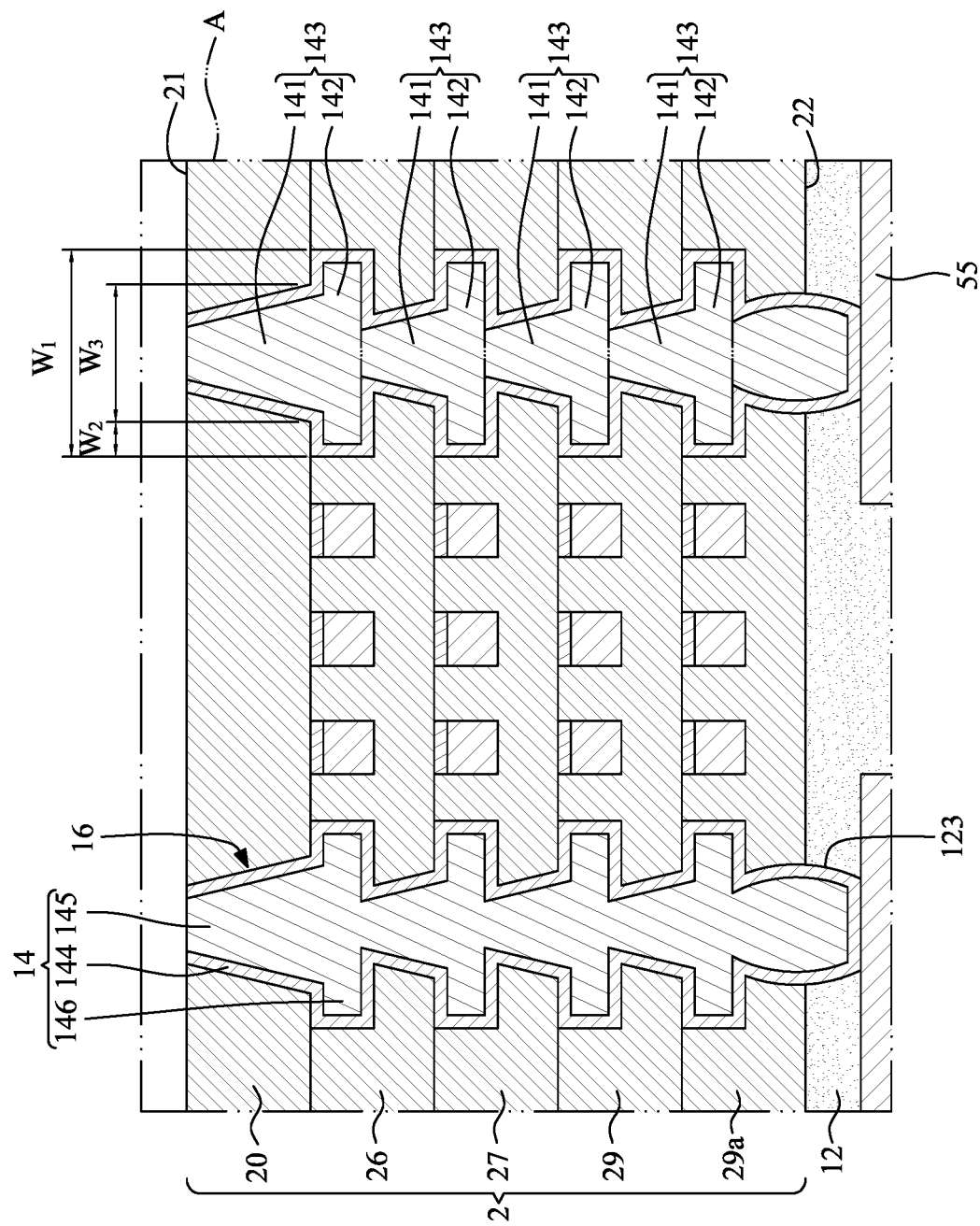
FIG. 2 illustrates a partially enlarged view of a region "A" in FIG. 1.

FIG. 1 illustrates a cross-sectional view of a wiring structure 1 according to some embodiments of the present disclosure. FIG. 2 illustrates a partially enlarged view of a region "A" in FIG. 1. The wiring structure 1 may include an upper conductive structure (e.g., a conductive structure) 2 and at least one conductive through via 14. In some embodiments, the wiring structure 1 may further include an intermediate layer 12 and a lower conductive structure 5.

The upper conductive structure 2 is disposed on the lower conductive structure 5, and includes a plurality of dielectric layers (including, for example, a first dielectric layer 20, a second dielectric layer 26, a third dielectric layer 27, a fourth dielectric layer 29 and a fifth dielectric layer 29a), a plurality of circuit layers 24 (formed of a metal, a metal alloy, or other conductive material) in contact with the dielectric layers 20, 26, 27, 29, 29a, and a plurality of inner conductive vias 25. In some embodiments, the upper conductive structure 2 may be similar to a coreless substrate, and may be a bumping level redistribution structure. The upper conductive structure 2 may be also referred to as "a high-density conductive structure" or "a high-density stacked structure". The circuit layers 24 of the upper conductive structure 2 may be also referred to as "a high-density circuit layer". In some embodiments, a density of a circuit line (including, for example, a trace or a pad) of the high-density circuit layer is greater than a density of a circuit line of a low-density circuit layer. That is, the count of the circuit line (including, for example, the trace or the pad) in a unit area of the high-density circuit layer is greater than the count of the circuit line in an equal unit area of the low-density circuit layer, such as about 1.2 times or greater, about 1.5 times or greater, or about 2 times or greater, or about 3 times or greater. Alternatively, or in combination, a line width/line space (L/S) of the high-density circuit layer is less than an L/S of the low-density circuit layer, such as about 90% or less, about 50% or less, or about 20% or less. Further, the conductive structure that includes the high-density circuit layer may be designated as the "high-density conductive structure", and the conductive structure that includes the low-density circuit layer may be designated as a "low-density conductive structure".

The upper conductive structure 2 has a top surface 21, a bottom surface 22 opposite to the top surface 21, and a lateral surface 23 extending between the top surface 21 and the bottom surface 22. As shown in FIG. 1, the dielectric layers 20, 26, 27, 29, 29a are stacked on one another. For example, the first dielectric layer 20 may be the topmost dielectric layer. In some embodiments, a material of the dielectric layers 20, 26, 27, 29, 29a is transparent, and can be seen through or detected by human eyes or machine. In some embodiments, a transparent material of the dielectric layers 20, 26, 27, 29, 29a has a light transmission for a wavelength in the visible range (or other pertinent wavelength for detection of a mark) of at least about 60%, at least about 70%, or at least about 80%. In some embodiments, a material of the dielectric layers 20, 26, 27, 29, 29a may be made of a cured photoimageable dielectric (PID) material such as epoxy or polyimide (PI) including photoinitiators.

The circuit layers 24 may be fan-out circuit layers or redistribution layers (RDLs), and an L/S of the circuit layers 24 may be less than about 10 μm/10 μm, less than or equal to 8 μm/8 μm, less than or equal to 5 μm/5 μm, less than or equal to 3 μm/3 μm, less than or equal to about 2 μm/about 2 or less than or equal to about 1.8 μm/about 1.8 μm. In some embodiments, the circuit layer 24 is embedded in the corresponding dielectric layers 20, 26, 27, 29, 29a. In some embodiments, each circuit layer 24 may include a seed layer 243 and a conductive material 244 (e.g., a plating metallic material) disposed on the seed layer 243. As shown in FIG. 1, the bottommost circuit layer 24 is covered by the fifth dielectric layer 29a. As illustrated in the embodiment of FIG. 1, a horizontally connecting or extending circuit layer may be omitted in the first dielectric layer 20.

Some of the inner conductive vias 25 are disposed between two adjacent circuit layers 24 for electrically connecting the two circuit layers 24. Some of the inner conductive vias 25 are exposed from the top surface 21 of the upper conductive structure 2 (e.g., the top surface of the first dielectric layer 20). In some embodiments, each inner conductive via 25 may include a seed layer 253 and a conductive material 254 (e.g., a plating metallic material) disposed on the seed layer 253. Each inner conductive via 25 tapers upwardly along a direction from the bottom surface 22 towards the top surface 21 of the upper conductive structure 2.

The conductive through via 14 extends through the upper conductive structure 2. The conductive through via 14 may be a monolithic or one-piece structure. A lateral side surface (i.e., a boundary between the conductive through via 14 and the dielectric layers 20, 26, 27, 29, 29a) of the conductive through via 14 is not a continuous or smooth surface. The conductive through via 14 may include a seed layer 144, a main portion 145 and at least one extending portion 146. In some embodiments, the conductive through via 14 includes a plurality of extending portions 146 protruding from the main portion 145. The main portion 145 and the extending portions 146 may be formed integrally and concurrently. In addition, the main portion 145 and the extending portions 146 may include a conductive material (e.g., a plating metallic material such as copper) disposed on the seed layer 144. The seed layer 144 may be interposed between the main portion 145 and the dielectric layers 20, 26, 27, 29, and between the extending portions 146 and the dielectric layers 20, 26, 27, 29, 29a. Thus, the main portion 145 and the extending portions 146 may not contact the dielectric layers 20, 26, 27, 29, 29a. In some embodiments, the seed layer 144 may be omitted. In some embodiments, the conductive material of the main portion 145 and the extending portions 146 of the conductive through via 14 may be different from the conductive material 244 of the circuit layer 24. For example, the conductive material of the main portion 145 and the extending portions 146 of the conductive through via 14 may include copper-iron composite, and the conductive material 244 of the circuit layer 24 may include copper sulfate. In addition, a lattice of the conductive material of the main portion 145 and the extending portions 146 of the conductive through via 14 may be different form a lattice of the conductive material 244 of the circuit layer 24. A grain size of the conductive material of the main portion 145 and the extending portions 146 of the conductive through via 14 may be greater than a grain size of the conductive material 244 of the circuit layer 24.

In some embodiments, a maximum width W1 of the conductive through via 14 may be less than or equal to 20 μm, less than or equal to 15 μm, or less than or equal to 10 μm. Further, a width W2 of the extending portion 146 may be less than or equal to 4 μm, less than or equal to 3 μm, or less than or equal to 1 μm.

The conductive through via 14 includes a plurality of unit portions 143 embedded in a respective one of the dielectric layers 20, 26, 27, 29, 29a. Each of the unit portions 143 includes a first portion 141 and a second portion 142. The first portion 141 may be embedded in an upper dielectric layer (e.g., the first dielectric layer 20), and the second portion 142 may be embedded in a lower dielectric layer (e.g., the second dielectric layer 26) under the upper dielectric layer (e.g., the first dielectric layer 20). A shape of the first portion 141 may be different from a shape of the second portion 142. The first portions 141 may extend through the dielectric layers 20, 26, 27, 29, and may taper along a same direction (e.g., taper upwardly along the direction from the bottom surface 22 towards the top surface 21 of the upper conductive structure 2). Thus, the tapering direction of the unit portion 143 is same as a tapering direction of the inner conductive via 25. A shape (and/or a size) of the first portion 141 of the unit portion 143 is substantially same as a shape (and/or a size) of the inner conductive via 25. In addition, the circuit layer 24 may include a plurality of pads 246 connecting to the bottom portion of inner conductive vias 25. The second portion 142 of the unit portion 143 may be connected to a bottom portion of the first portion 141 of the unit portion 143, and may be disposed on a surface of the dielectric layers 20, 26, 27, 29. A shape (and/or a size) of the second portion 142 of the unit portion 143 is substantially same as a shape (and/or a size) of the pad 246 of the circuit layer 24.

The first portions 141 of the unit portions 143 may be arranged substantially in a row, and may be aligned with one another. The first portions 141 and the central portions of the second portion 142 between two first portions 141 form the main portion 145. Further, a width W1 of the second portion 142 of the unit portion 143 is greater than a width W3 of the first portion 141 of the unit portions 143, so that the peripheral portion of the second portion 142 form the extending portion 146. The width W2 of the extending portion 146 is equal to (W1−W3)/2. In some embodiments, the extending portion 146 (i.e., the peripheral portion) of the second portion 142 is disposed on a surface of the upper dielectric layer (i.e., the first dielectric layer 20).

The lower conductive structure 5 includes at least one dielectric layer (including, for example, three dielectric layers 50), at least one circuit layer (including, for example, three upper circuit layers 55 and one lower circuit layer 54 formed of a metal, a metal alloy, or other conductive material) in contact with the dielectric layer(s) 50 and at least one inner conductive via 56 (including, for example, a plurality of inner conductive vias 56). In some embodiments, the lower conductive structure 5 may be similar to a coreless substrate. The lower conductive structure 5 may be also referred to as "a substrate structure", "a lower stacked structure" or "a low-density conductive structure" or "a low-density stacked structure". The circuit layers 55, 54 of the lower conductive structure 5 may be also referred to as "a low-density circuit layer". As shown in FIG. 1, the lower conductive structure 5 has a top surface 51, a bottom surface 52 opposite to the top surface 51, and a lateral surface 53 extending between the top surface 51 and the bottom surface 52. The lateral surface 23 of the upper conductive structure 2 may be displaced or recessed from the lateral surface 53 of the lower conductive structure 5. In some embodiments, the lateral surface 23 of the upper conductive structure 2 may be substantially coplanar with the lateral surface 53 of the lower conductive structure 5.

The lower circuit layer 54 is embedded in the bottommost dielectric layer 50, and exposed from the bottom surface of the bottommost dielectric layer 50. The upper circuit layers 55 are disposed on the dielectric layers 50. Some of the inner conductive vias 56 are disposed between two adjacent upper circuit layers 55 for electrically connecting the two upper circuit layers 55. The inner conductive vias 56 and the upper circuit layer 55 may be formed integrally and concurrently. Some of the inner conductive vias 56 are disposed between the upper circuit layer 55 and the lower circuit layer 54 for electrically connecting the upper circuit layer 55 and the lower circuit layer 54. Each inner conductive via 56 tapers downwardly along a direction from the top surface 51 towards the bottom surface 52 of the lower conductive structure 5. Thus, a tapering direction of the inner conductive via 56 of the lower conductive structure 5 is different from the tapering direction of the unit portion 143 of the conductive through via 14 and the tapering direction of the inner conductive via 25 of the upper conductive structure 2.

A thickness of each of the dielectric layers 20, 26, 27, 29, 29a of the upper conductive structure 2 is less than or equal to about 40%, less than or equal to about 35%, or less than or equal to about 30% of a thickness of each of the dielectric layers 50 of the lower conductive structure 5. In addition, a material of the dielectric layers 50 of the lower conductive structure 5 may be different from the material of the dielectric layers 20, 26, 27, 29, 29a of the upper conductive structure 2. For example, the material of the dielectric layers 50 of the lower conductive structure 5 may be polypropylene (PP) or ajinomoto build-up film (ABF).

An L/S of the upper circuit layer 55 and the lower circuit layer 54 may be greater than or equal to about 10 pin/about 10 μm. Thus, the L/S of the upper circuit layer 55 and the lower circuit layer 54 may be greater than or equal to about five times the L/S of the circuit layers 24 of the upper conductive structure 2. In addition, in some embodiments, the topmost upper circuit layer 55 is disposed on and protrudes from the top surface of the topmost dielectric layer 50 (i.e., the top surface 51 of the lower conductive structure 5).

The intermediate layer 12 is interposed or disposed between the upper conductive structure 5 and the lower conductive structure 3 to bond the upper conductive structure 5 and the lower conductive structure 3 together. That is, the intermediate layer 12 adheres to the bottom surface 22 of the upper conductive structure 2 and the top surface 51 of the lower conductive structure 5. In some embodiments, the intermediate layer 12 may be an adhesion layer that is cured from an adhesive material (e.g., includes a cured adhesive material such as an adhesive polymeric material). Thus, the intermediate layer 12 contacts the bottommost dielectric layer (i.e., the fifth dielectric layer 29a) of the upper conductive structure 2, and the topmost upper circuit layer 55 of the lower conductive structure 5 is embedded in the intermediate layer 12. In some embodiments, a bonding force between two adjacent dielectric layers 20, 26, 27, 29, 29a of the upper conductive structure 2 is greater than a bonding force between the fifth dielectric layer 29a of the upper conductive structure 2 and the intermediate layer 12. A surface roughness of a boundary between two adjacent dielectric layers 20, 26, 27, 29, 29a of the upper conductive structure 2 is greater than a surface roughness of a boundary between the fifth dielectric layer 29a of the upper conductive structure 2 and the intermediate layer 12, such as about 1.1 times or greater, about 1.3 times or greater, or about 1.5 times or greater in terms of root mean squared surface roughness.

In some embodiments, a material of the intermediate layer 12 is transparent, and can be seen through by human eyes or machine. That is, a mark disposed adjacent to the top surface 51 of the lower conductive structure 5 can be recognized or detected from the top surface 21 of the upper conductive structure 2 by human eyes or machine. In addition, the material of intermediate layer 12 may be different from the material of the dielectric layers 50 the lower conductive structure 5 and the material of the dielectric layers 20, 26, 27, 29, 29a of the upper conductive structure 2. For example, the material of the intermediate layer 12 may be ABF, or ABF-like dielectric film. Furthermore, the fifth dielectric layer 29a and the intermediate layer 12 define at least one through hole 123. In some embodiments, the through hole 123 extends through the fifth dielectric layer 29a and the intermediate layer 12, and terminates at or on a topmost upper circuit layer 55 of the lower conductive structure 5. The through hole 123 may expose a portion of the topmost upper circuit layer 55 of the lower conductive structure 5. An inner sidewall of the through hole 123 may be curved.

As shown in FIG. 1 and FIG. 2, the through hole 123 may be aligned with and in communication with the accommodating hole 16 of the upper conductive structure 2 for accommodating the conductive through via 14. Thus, a bottom portion of the conductive through via 14 may be disposed in the through hole 123. The conductive through via 14 may further extend through the intermediate layer 12, and is electrically connected to the topmost upper circuit layer 55 of the lower conductive structure 5. The conductive through via 14 extends from the top surface 21 of the upper conductive structure 2 to the bottom surface of the intermediate layer 12 to terminate at or on a portion of the topmost upper circuit layer 55 of the lower conductive structure 5. Thus, a length of the conductive through via 14 is greater than a thickness of the upper conductive structure 2. In some embodiments, the upper conductive structure 2 is electrically connected to the lower conductive structure 5 only through the conductive through via 14.

As shown in the embodiment illustrated in FIG. 1 and FIG. 2, the wiring structure 1 is a combination of the upper conductive structure 2 and the lower conductive structure 5, in which the circuit layers 24 of the upper conductive structure 2 has fine pitch, high yield and low thickness; and the upper circuit layers 55 of the lower conductive structure 5 have low manufacturing cost. Thus, the wiring structure 1 has an advantageous compromise of yield and manufacturing cost, and the wiring structure 1 has a relatively low thickness. The manufacturing yield for one layer of the circuit layers 24 of the upper conductive structure 2 may be 99%, and the manufacturing yield for one layer of the upper circuit layers 55 of the lower conductive structure 5 may be 90%. Thus, the yield of the wiring structure 1 may be improved. In addition, the warpage of the upper conductive structure 2 and the warpage of the lower conductive structure 5 are separated and will not influence each other. Thus, the warpage of the lower conductive structure 5 will not be accumulated onto the warpage of the upper conductive structure 2. Thus, the yield of the wiring structure 1 may be further improved.

Figure 24:
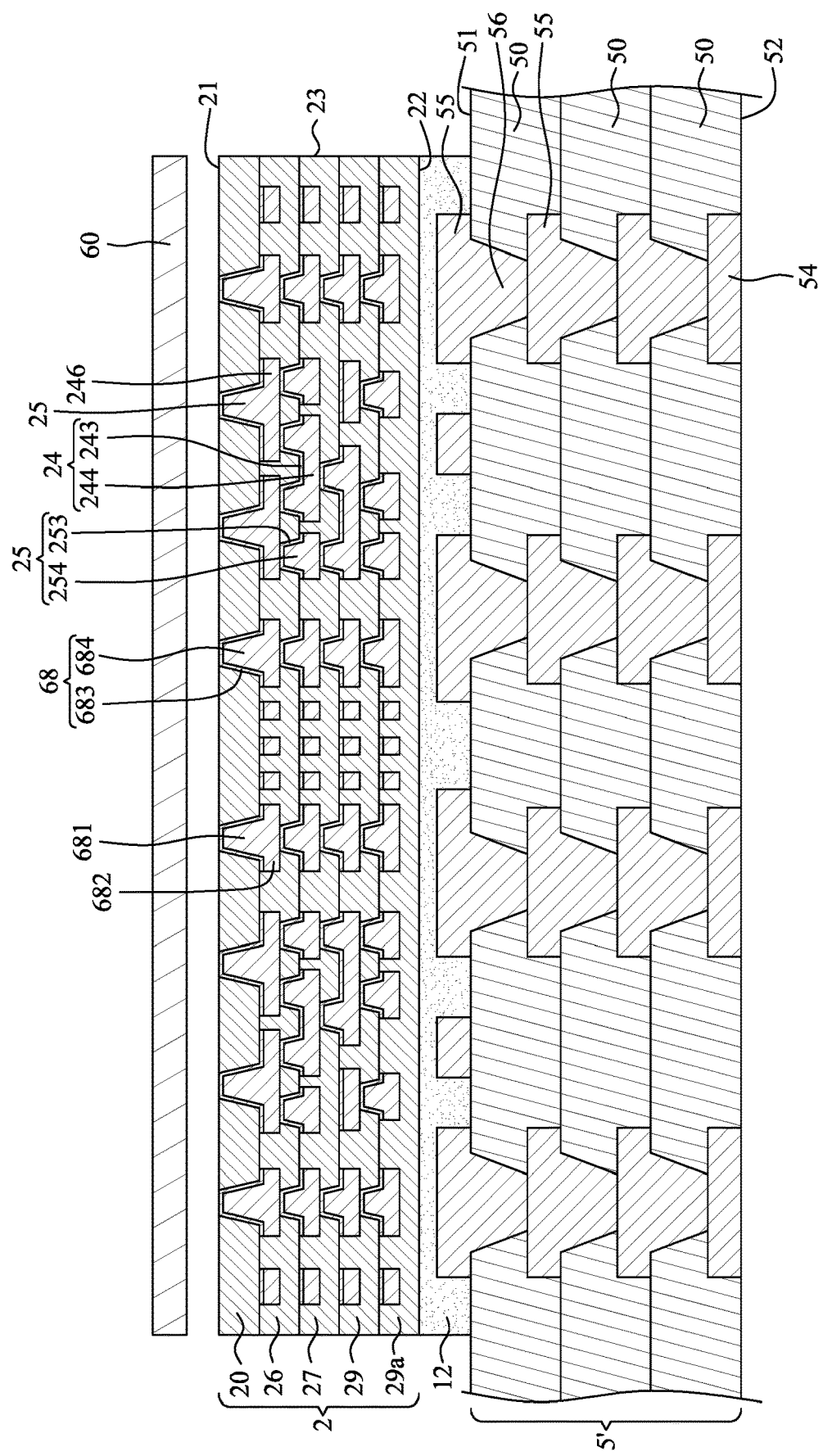
FIG. 24 illustrates one or more stages of an example of a method for manufacturing a wiring structure according to some embodiments of the present disclosure.

In addition, during the manufacturing process, the conductive through via 14 is formed or disposed in the accommodating hole 16 formed from a plurality of stacked portions 68 (including, for example, via portions 681 and pad portions 682) (FIG. 24). That is, the stacked portions 68 (including, for example, via portions 681 and pad portions 682) (FIG. 24) are removed completely to form the empty accommodating hole 16, then the conductive through via 14 is formed or disposed in the accommodating hole 16. Thus, a width and a profile of the accommodating hole 16 are defined and limited by the stacked portions 68 (FIG. 24). As a result, a width of the accommodating hole 16 may be relatively small, and the accommodating hole 16 may not have a barrel shape. Accordingly, the width of the conductive through via 14 may be relatively small, and the conductive through via 14 may not have a barrel shape.

Figure 3:
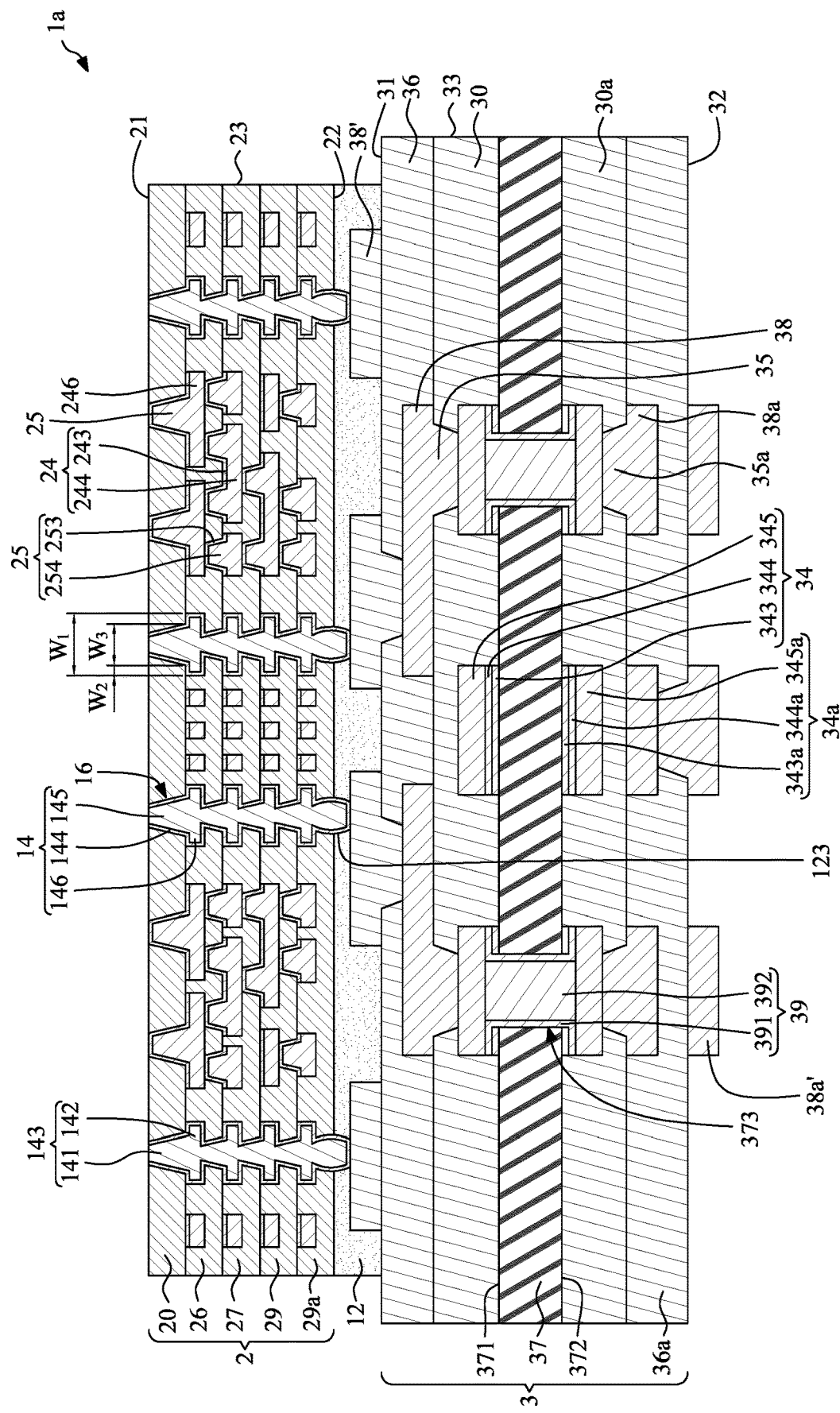
FIG. 3 illustrates a cross-sectional view of a wiring structure according to some embodiments of the present disclosure.

FIG. 3 illustrates a cross-sectional view of a wiring structure 1a according to some embodiments of the present disclosure. The wiring structure 1a is similar to the wiring structure 1 shown in FIG. 1, except for a structure of the lower conductive structure 3. As shown in FIG. 3, the lower conductive structure 3 includes at least one dielectric layer (including, for example, one first upper dielectric layer 30, one second upper dielectric layer 36, one first lower dielectric layer 30a and one second lower dielectric layer 36a) and at least one circuit layer (including, for example, one first upper circuit layer 34, two second upper circuit layers 38, 38', one first lower circuit layer 34a and two second lower circuit layers 38a, 38a' formed of a metal, a metal alloy, or other conductive material) in contact with the dielectric layer (e.g., the first upper dielectric layer 30, the second upper dielectric layer 36, the first lower dielectric layer 30a and the second lower dielectric layer 36a). In some embodiments, the lower conductive structure 3 may be similar to a core substrate that further includes a core portion 37. The lower conductive structure 3 may be also referred to as "a substrate structure", "a lower stacked structure" or "a low-density conductive structure" or "a low-density stacked structure". The circuit layer (including, for example, the first upper circuit layer 34, the two second upper circuit layers 38, 38', the first lower circuit layer 34a and the two second lower circuit layers 38a, 38a') of the lower conductive structure 3 may be also referred to as "a low-density circuit layer". As shown in FIG. 3, the lower conductive structure 3 has a top surface 31, a bottom surface 32 opposite to the top surface 31, and a lateral surface 33 extending between the top surface 31 and the bottom surface 32. The lower conductive structure 3 may include a plurality of dielectric layers (for example, the first upper dielectric layer 30, the second upper dielectric layer 36, the first lower dielectric layer 30a and the second lower dielectric layer 36a), a plurality of circuit layers (for example, the first upper circuit layer 34, the two second upper circuit layers 38, 38', the first lower circuit layer 34a and the two second lower circuit layers 38a, 38a') and at least one inner conductive via (including, for example, a plurality of upper interconnection vias 35 and a plurality of lower interconnection vias 35a). As shown in FIG. 3, the lateral surface 23 of the upper conductive structure 2 may be displaced or recessed from the lateral surface 33 of the lower conductive structure 3.

The core portion 37 has a top surface 371 and a bottom surface 372 opposite to the top surface 371, and defines a plurality of first through holes 373 extending through the core portion 37. An interconnection via 39 is disposed or formed in each first through hole 373 for vertical connection. In some embodiments, the interconnection via 39 includes a base metallic layer 391 and an insulation material 392. The base metallic layer 391 is disposed or formed on a side wall of the first through hole 373, and defines a central through hole. The insulation material 392 fills the central through hole defined by the base metallic layer 391. In some embodiments, the interconnection via 39 may omit an insulation material, and may include a bulk metallic material that fills the first through hole 373.

The first upper dielectric layer 30 is disposed on the top surface 371 of the core portion 37. The second upper dielectric layer 36 is stacked or disposed on the first upper dielectric layer 30. In addition, the first lower dielectric layer 30a is disposed on the bottom surface 372 of the core portion 37. The second lower dielectric layer 36a is stacked or disposed on the first lower dielectric layer 30a.

A thickness of each of the dielectric layers 20, 26, 27, 29, 29a of the upper conductive structure 2 is less than or equal to about 40%, less than or equal to about 35%, or less than or equal to about 30% of a thickness of each of the dielectric layers 30, 36, 30a, 36a of the lower conductive structure 3. In addition, a material of the dielectric layers 30, 36, 30a, 36a of the lower conductive structure 3 may be different from the material of the dielectric layers 20, 26, 27, 29, 29a of the upper conductive structure 2. For example, the material of the dielectric layers 30, 36, 30a, 36a of the lower conductive structure 3 may be polypropylene (PP) or ajinomoto build-up film (ABF).

An L/S of the first upper circuit layer 34 may be greater than or equal to about 10 pin/about 10 µm. Thus, the L/S of the first upper circuit layer 34 may be greater than or equal to about five times the L/S of the circuit layers 24 of the upper conductive structure 2. In some embodiments, the first upper circuit layer 34 is formed or disposed on the top surface 371 of the core portion 37, and covered by the first upper dielectric layer 30. In some embodiments, the first upper circuit layer 34 may include a first metallic layer 343, a second metallic layer 344 and a third metallic layer 345. The first metallic layer 343 is disposed on the top surface 371 of the core portion 37, and may be formed from a copper foil (e.g., may constitute a portion of the copper foil). The second metallic layer 344 is disposed on the first metallic layer 343, and may be a plated copper layer. The third metallic layer 345 is disposed on the second metallic layer 344, and may be another plated copper layer. In some embodiments, the third metallic layer 345 may be omitted.

An L/S of the second upper circuit layer 38 may be greater than or equal to about 10 pin/about 10 µm. Thus, the L/S of the second upper circuit layer 38 may be substantially equal to the L/S of the first upper circuit layer 34, and may be greater than or equal to about five times the L/S of the circuit layers 24 of the upper conductive structure 2. In some embodiments, the second upper circuit layer 38 is formed or disposed on the first upper dielectric layer 30, and covered by the second upper dielectric layer 36. In some embodiments, the second upper circuit layer 38 is electrically connected to the first upper circuit layer 34 through the upper interconnection vias 35. That is, the upper interconnection vias 35 are disposed between the second upper circuit layer 38 and the first upper circuit layer 34 for electrically connecting the second upper circuit layer 38 and the first upper circuit layer 34. In some embodiments, the second upper circuit layer 38 and the upper interconnection vias 35 are formed integrally as a monolithic or one-piece structure. Each upper interconnection via 35 tapers downwardly along a direction from the top surface 31 towards the bottom surface 32 of the lower conductive structure 3.

In addition, in some embodiments, the second upper circuit layer 38' is disposed on and protrudes from the top surface of the second upper dielectric layer 36. In some embodiments, the second upper circuit layer 38 is electrically connected to the second upper circuit layer 38' through the upper interconnection vias 35. In some embodiments, the second upper circuit layer 38' is the topmost circuit layer of the lower conductive structure 3. The conductive through via 14 is electrically connected to and contacts the second upper circuit layer 38' of the lower conductive structure 3.

An L/S of the first lower circuit layer 34a may be greater than or equal to about 10 µm/about 10 µm. Thus, the L/S of the first lower circuit layer 34a may be greater than or equal to about five times the L/S of the circuit layers 24 of the upper conductive structure 2. In some embodiments, the first lower circuit layer 34a is formed or disposed on the bottom surface 372 of the core portion 37, and covered by the first lower dielectric layer 30a. In some embodiments, the first lower circuit layer 34a may include a first metallic layer 343a, a second metallic layer 344a and a third metallic layer 345a. The first metallic layer 343a is disposed on the bottom surface 372 of the core portion 37, and may be formed from a copper foil. The second metallic layer 344a is disposed on the first metallic layer 343a, and may be a plated copper layer. The third metallic layer 345a is disposed on the second metallic layer 344a, and may be another plated copper layer. In some embodiments, the third metallic layer 345a may be omitted.

An L/S of the second lower circuit layer 38a may be greater than or equal to about 10 µm/about 10 µm. Thus, the L/S of the second lower circuit layer 38a may be substantially equal to the L/S of the first upper circuit layer 34, and may be greater than or equal to about five times the L/S of the circuit layers 24 of the upper conductive structure 2. In some embodiments, the second lower circuit layer 38a is formed or disposed on the first lower dielectric layer 30a, and covered by the second lower dielectric layer 36a. In some embodiments, the second lower circuit layer 38a is electrically connected to the first lower circuit layer 34a through the lower interconnection vias 35a. That is, the lower interconnection vias 35a are disposed between the second lower circuit layer 38a and the first lower circuit layer 34a for electrically connecting the second lower circuit layer 38a and the first lower circuit layer 34a. In some embodiments, the second lower circuit layer 38a and the lower interconnection vias 35a are formed integrally as a monolithic or one-piece structure. The lower interconnection via 35a tapers upwardly along a direction from the bottom surface 32 towards the top surface 31 of the lower conductive structure 3.

In addition, in some embodiments, the second lower circuit layer 38a' is disposed on and protrudes from the bottom surface of the second lower dielectric layer 36a. In some embodiments, the second lower circuit layer 38a' is electrically connected to the second lower circuit layer 38a through the lower interconnection vias 35a. That is, the lower interconnection vias 35a are disposed between the second lower circuit layers 38a, 38a' for electrically connecting the second lower circuit layers 38a, 38a'. In some embodiments, the second lower circuit layer 38a' is the bottommost low-density circuit layer of the lower conductive structure 3.

In some embodiments, each interconnection via 39 electrically connects the first upper circuit layer 34 and the first lower circuit layer 34a. The base metallic layer 391 of the interconnection via 39, the second metallic layer 344 of the first upper circuit layer 34 and the second metallic layer 344a the first lower circuit layer 34a may be formed integrally and concurrently as a monolithic or one-piece structure.

Figure 4:
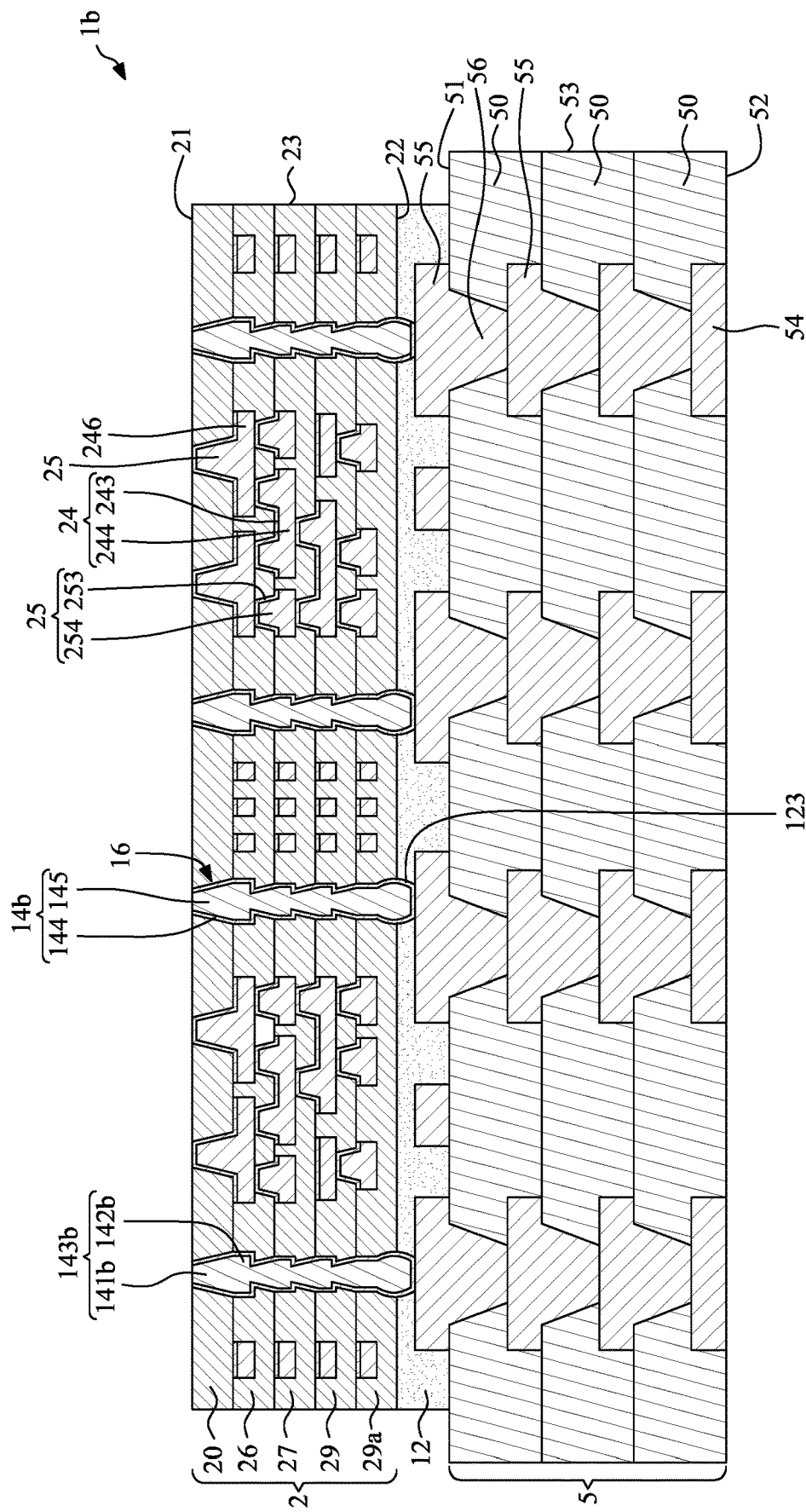
FIG. 4 illustrates a cross-sectional view of a wiring structure according to some embodiments of the present disclosure.

FIG. 4 illustrates a cross-sectional view of a wiring structure 1b according to some embodiments of the present disclosure. The wiring structure 1b is similar to the wiring structure 1 shown in FIG. 1, except for a structure of the conductive through via 14b. As shown in FIG. 4, the second portion 142b of the unit portion 143b of the conductive through via 14b does not include the extending portion 146 (i.e., the peripheral portion) of FIG. 1. Thus, the width W2 of the extending portion 146 may be equal to zero.

Figure 5:
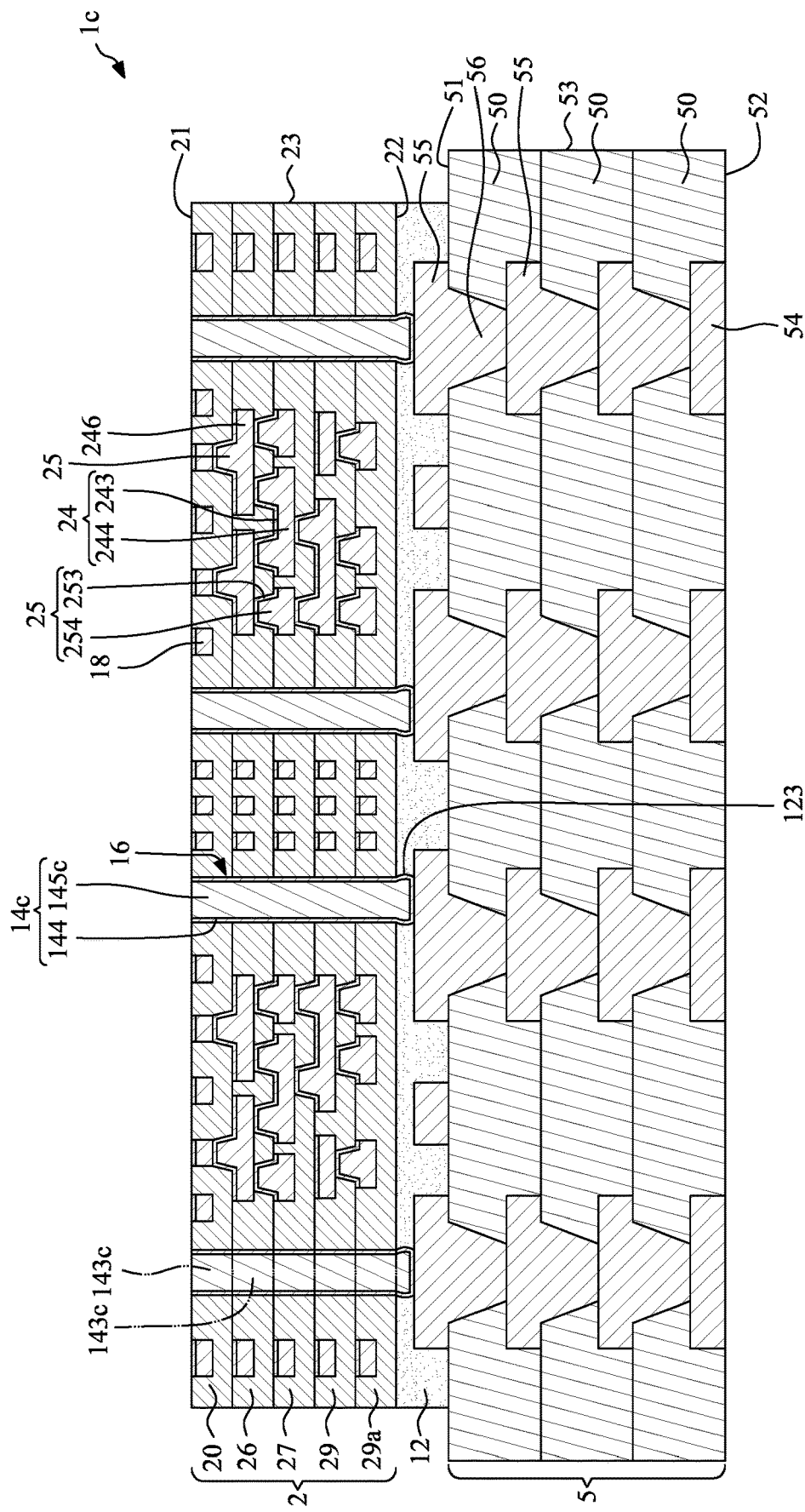
FIG. 5 illustrates a cross-sectional view of a wiring structure according to some embodiments of the present disclosure.

FIG. 5 illustrates a cross-sectional view of a wiring structure 1c according to some embodiments of the present disclosure. The wiring structure 1c is similar to the wiring structure 1 shown in FIG. 1, except for a structure of the conductive through via 14c. As shown in FIG. 5, the unit portion 143c of the conductive through via 14c does not include the extending portion 146 (i.e., the peripheral portion) of FIG. 1. Further, the unit portion 143c has a consistent width (i.e., the unit portion 143c does not taper), and a cross section of the unit portion 143c is in a substantially rectangular shape. A thickness of each of the unit portions 143c is substantially equal to a thickness of the respective one of the dielectric layers 20, 26, 27, 29, 29a. In some embodiments, all of the unit portions 143c are aligned with one another. The sidewalls of the unit portions 143c are substantially coplanar with each other. Thus, the main portion 145c has a consistent width, and the main portion 145c may be a straight column. The sidewall of the main portion 145c may be a straight surface. In addition, the wiring structure 1c may further include an outer circuit layer 18. The outer circuit layer 18 is embedded in the first dielectric layer 20 and is exposed from the top surface 21 of the upper conductive structure 2. The topmost inner conductive vias 25 of the upper conductive structure 2 are electrically connected to or contact a portion of the outer circuit layer 18.

Figure 6:
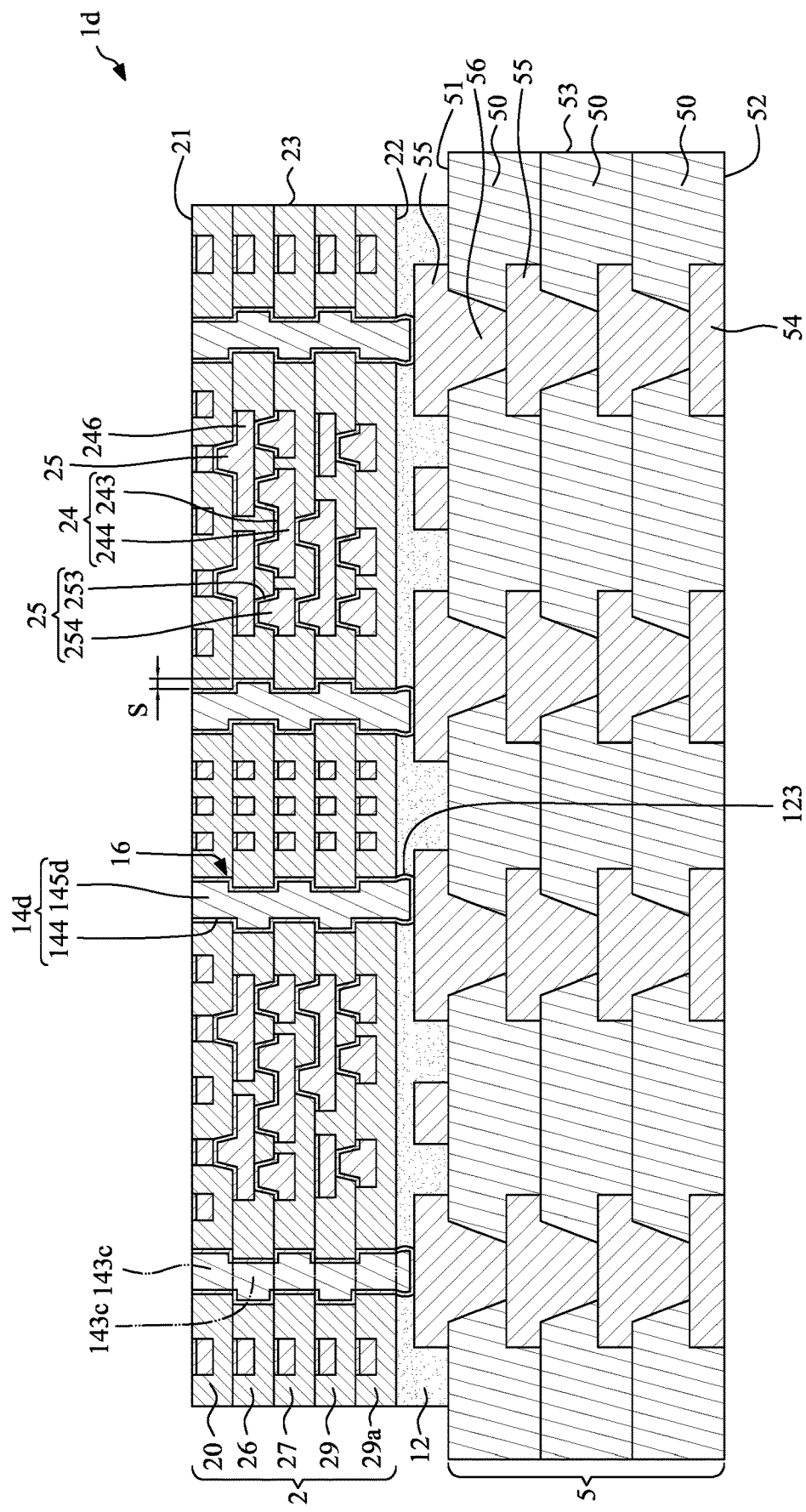
FIG. 6 illustrates a cross-sectional view of a wiring structure according to some embodiments of the present disclosure.

FIG. 6 illustrates a cross-sectional view of a wiring structure 1d according to some embodiments of the present disclosure. The wiring structure 1d is similar to the wiring structure 1c shown in FIG. 5, except for a structure of the conductive through via 14d. As shown in FIG. 6, the unit portions 143c are misaligned with one another. A shift S is formed between two adjacent ones of the unit portions 143c. The sidewalls of the unit portions 143c are displaced from one another. Thus, the main portion 145d may be not a straight column.

Figure 7:
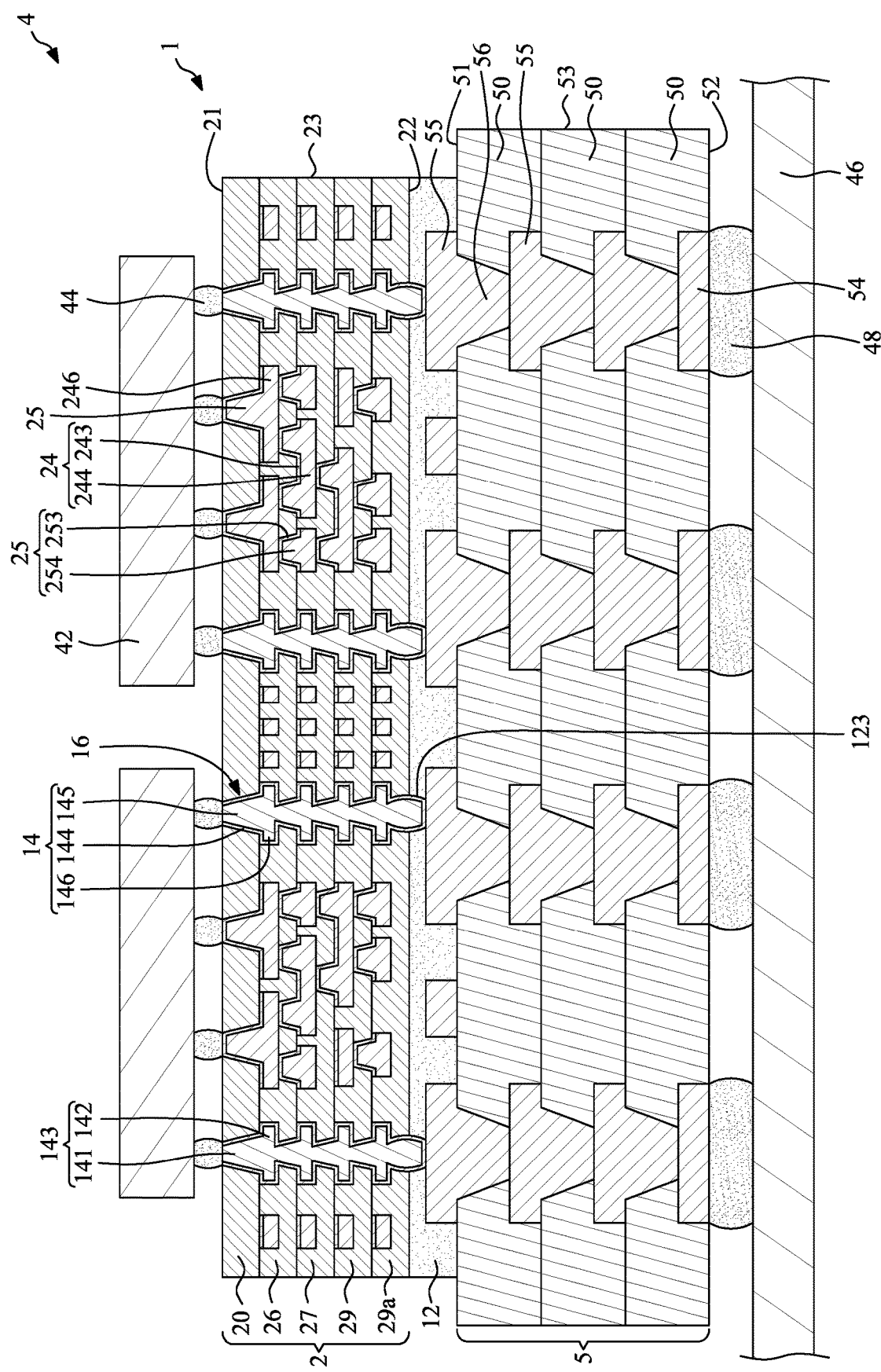
FIG. 7 illustrates a cross-sectional view of a bonding of a package structure and a substrate according to some embodiments of the present disclosure.

FIG. 7 illustrates a cross-sectional view of a bonding of a package structure 4 and a substrate 46 according to some embodiments. The package structure 4 includes a wiring structure 1, a semiconductor chip 42, a plurality of first connecting elements 44 and a plurality of second connecting elements 48. The wiring structure 1 of FIG. 7 is similar to the wiring structure 1 shown in FIG. 1. The semiconductor chip 42 is electrically connected and bonded to the conductive through via(s) 14 and the exposed inner conductive via 25 of the upper conductive structure 2 through the first connecting elements 44 (e.g., solder bumps or other conductive bumps). The lower circuit layer 54 of the lower conductive structure 5 is electrically connected and bonded to the substrate 46 (e.g., a mother board such as a printed circuit board (PCB)) through the second connecting elements 48 (e.g., solder bumps or other conductive bumps).

Figure 8:
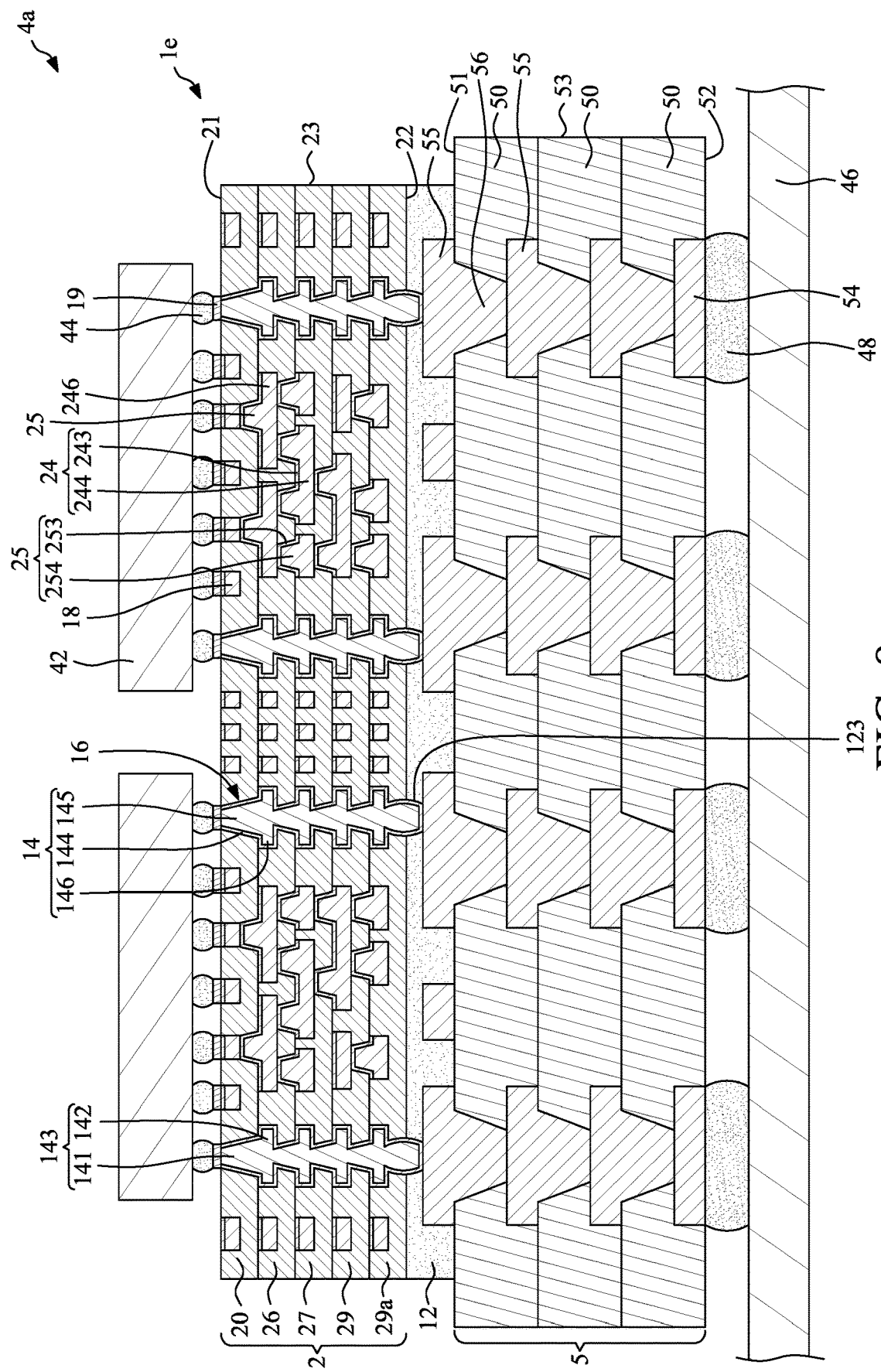
FIG. 8 illustrates a cross-sectional view of a bonding of a package structure and a substrate according to some embodiments of the present disclosure.

FIG. 8 illustrates a cross-sectional view of a bonding of a package structure 4a and a substrate 46 according to some embodiments. The package structure 4a includes a wiring structure 1e, a semiconductor chip 42, a plurality of first connecting elements 44 and a plurality of second connecting elements 48. The wiring structure 1e of FIG. 8 is similar to the wiring structure 1 shown in FIG. 1, except that an outer circuit layer 18 and a plurality of under bump metallurgies (UBMs) 19 are further included. The outer circuit layer 18 is embedded in the first dielectric layer 20 and is exposed from the top surface 21 of the upper conductive structure 2. The inner conductive vias 25 of the upper conductive structure 2 are electrically connected to or contact the outer circuit layer 18. The UBMs 19 are disposed on the exposed portions of the outer circuit layer 18 and the conductive through via(s) 14. The semiconductor chip 42 is electrically connected and bonded to the UBMs 19 through the first connecting elements 44 (e.g., solder bumps or other conductive bumps). The lower circuit layer 54 of the lower conductive structure 5 is electrically connected and bonded to the substrate 46 (e.g., a mother board such as a printed circuit board (PCB)) through the second connecting elements 48 (e.g., solder bumps or other conductive bumps).

Figure 9:
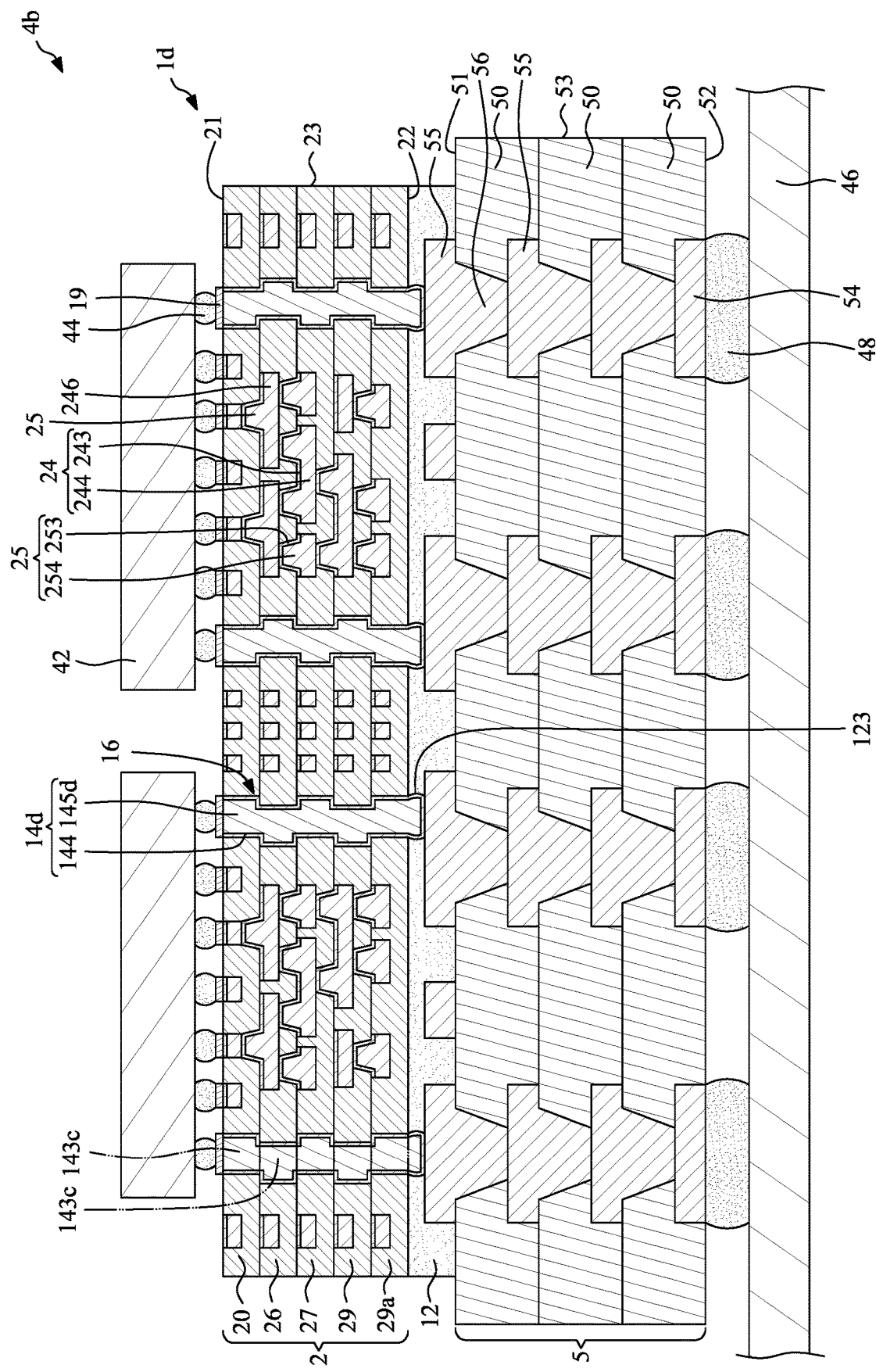
FIG. 9 illustrates a cross-sectional view of a bonding of a package structure and a substrate according to some embodiments of the present disclosure.

FIG. 9 illustrates a cross-sectional view of a bonding of a package structure 4b and a substrate 46 according to some embodiments. The package structure 4b includes a wiring structure 1d, a semiconductor chip 42, a plurality of first connecting elements 44 and a plurality of second connecting elements 48. The wiring structure 1d of FIG. 9 is similar to the wiring structure 1d shown in FIG. 6, except that an outer circuit layer 18 and a plurality of under bump metallurgies (UBMs) 19 are further included. The outer circuit layer 18 is embedded in the first dielectric layer 20 and is exposed from the top surface 21 of the upper conductive structure 2. The inner conductive vias 25 of the upper conductive structure 2 are electrically connected to or contact the outer circuit layer 18. The UBMs 19 are disposed on the exposed portions of the outer circuit layer 18 and the conductive through via(s) 14. The semiconductor chip 42 is electrically connected and bonded to the UBMs 19 through the first connecting elements 44 (e.g., solder bumps or other conductive bumps). The lower circuit layer 54 of the lower conductive structure 5 is electrically connected and bonded to the substrate 46 (e.g., a mother board such as a printed circuit board (PCB)) through the second connecting elements 48 (e.g., solder bumps or other conductive bumps).

FIG. 10 through FIG. 28 illustrate a method for manufacturing a wiring structure according to some embodiments of the present disclosure. In some embodiments, the method is for manufacturing the wiring structure 1 shown in FIG. 1.

Figure 10:
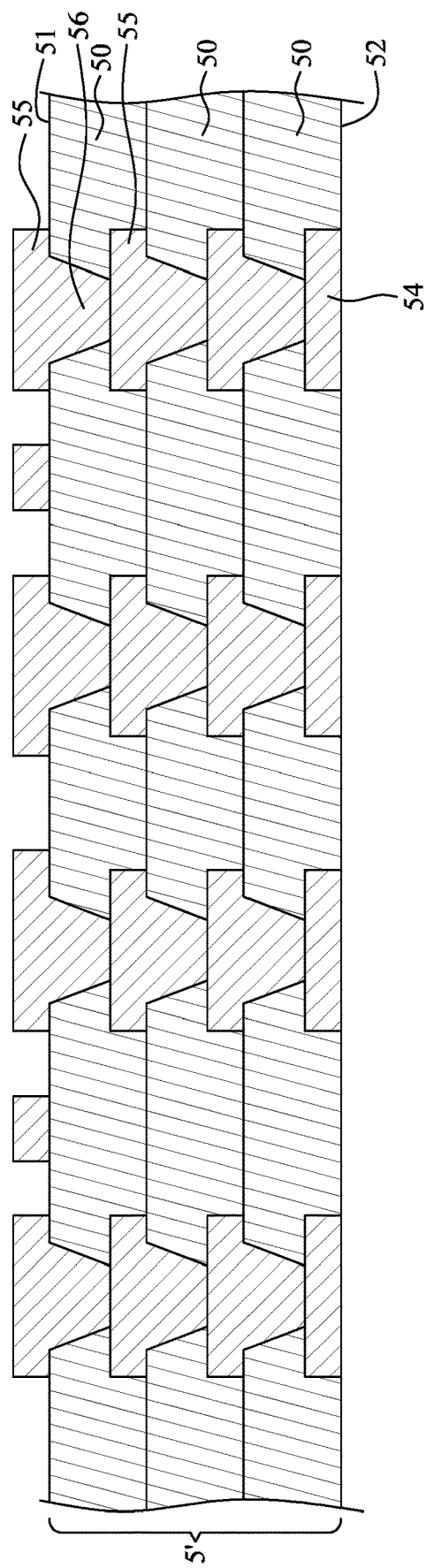
FIG. 10 illustrates one or more stages of an example of a method for manufacturing a wiring structure according to some embodiments of the present disclosure.

Referring to FIG. 10, a lower conductive structure 5' is provided. The lower conductive structure 5' is similar to the lower conductive structure 5 of FIG. 1, and includes the dielectric layers 50, the circuit layers 55, 54 and the inner conductive vias 56. An electrical property (such as open circuit/short circuit) of the lower conductive structure 5' may be tested.

Figure 11:
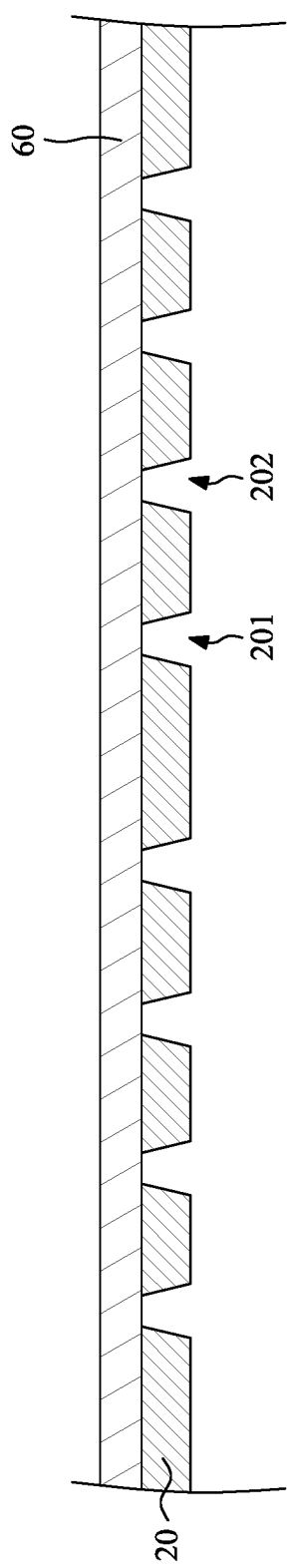
FIG. 11 illustrates one or more stages of an example of a method for manufacturing a wiring structure according to some embodiments of the present disclosure.

Referring to FIG. 11 through FIG. 22, an upper conductive structure 2 is provided. The upper conductive structure 2 is manufactured as follows. Referring to FIG. 11, a carrier 60 is provided. The carrier 60 may be a glass carrier, and may be in a wafer type, a panel type or a strip type. Then, a patterned first dielectric layer 20 is formed on the carrier 60. The patterned first dielectric layer 20 defines at least one first opening 201 and at least one second opening 202 extending through the first dielectric layer 20. A width of the first opening 201 may be equal to a width of the second opening 202.

Figure 12:
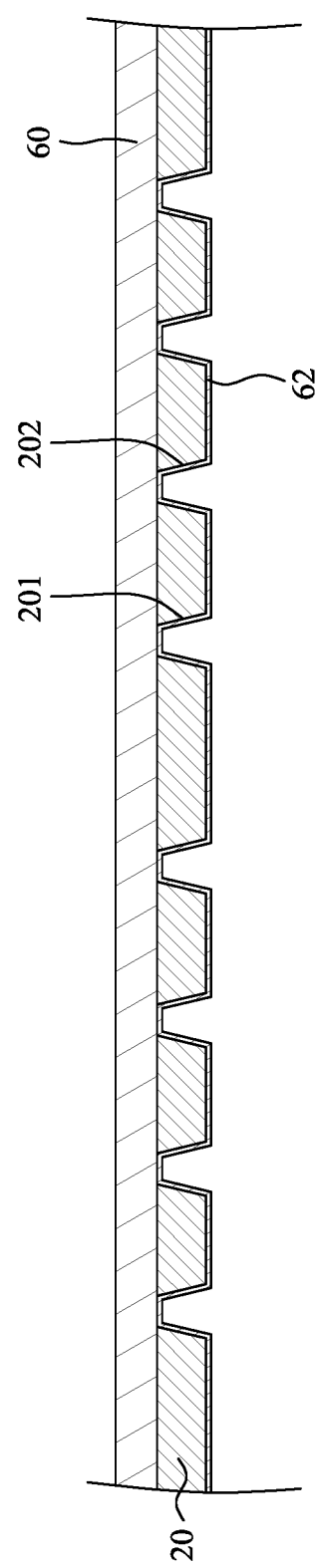
FIG. 12 illustrates one or more stages of an example of a method for manufacturing a wiring structure according to some embodiments of the present disclosure.

Referring to FIG. 12, a seed layer 62 is formed or disposed on the first dielectric layer 20, the first opening 201 and the second opening 202 by a physical vapor deposition (PVD) technique or other suitable techniques.

Figure 13:
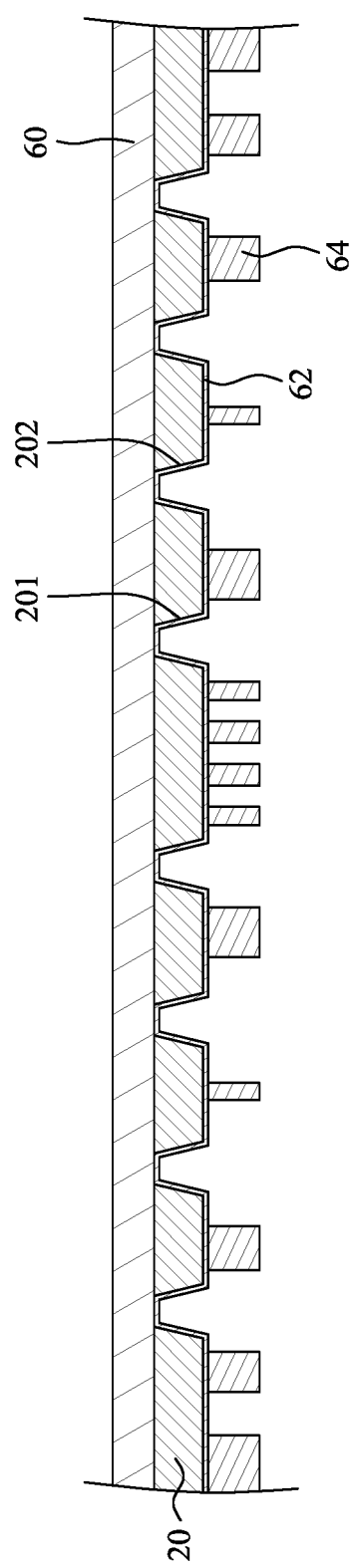
FIG. 13 illustrates one or more stages of an example of a method for manufacturing a wiring structure according to some embodiments of the present disclosure.

Referring to FIG. 13, a first photoresist layer 64 is formed or disposed on the seed layer 62. Then, the first photoresist layer 64 is patterned to form a plurality of openings to expose portions of the seed layer 62 by an exposure and development technique or other suitable techniques.

Figure 14:
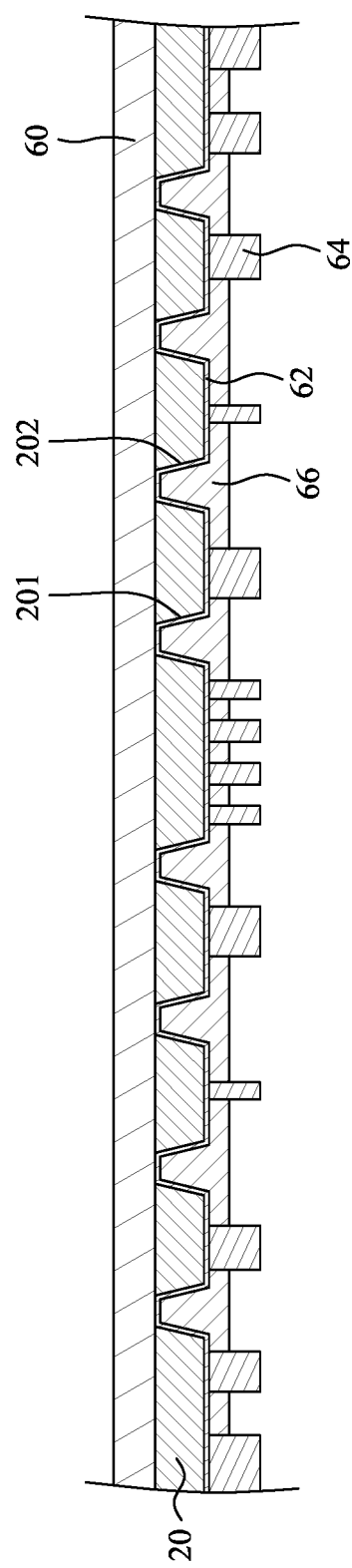
FIG. 14 illustrates one or more stages of an example of a method for manufacturing a wiring structure according to some embodiments of the present disclosure.

Referring to FIG. 14, a conductive material 66 (e.g., a metallic material) is disposed in the openings of the first photoresist layer 64 and on the seed layer 62 by a plating technique or other suitable techniques.

Figure 15:
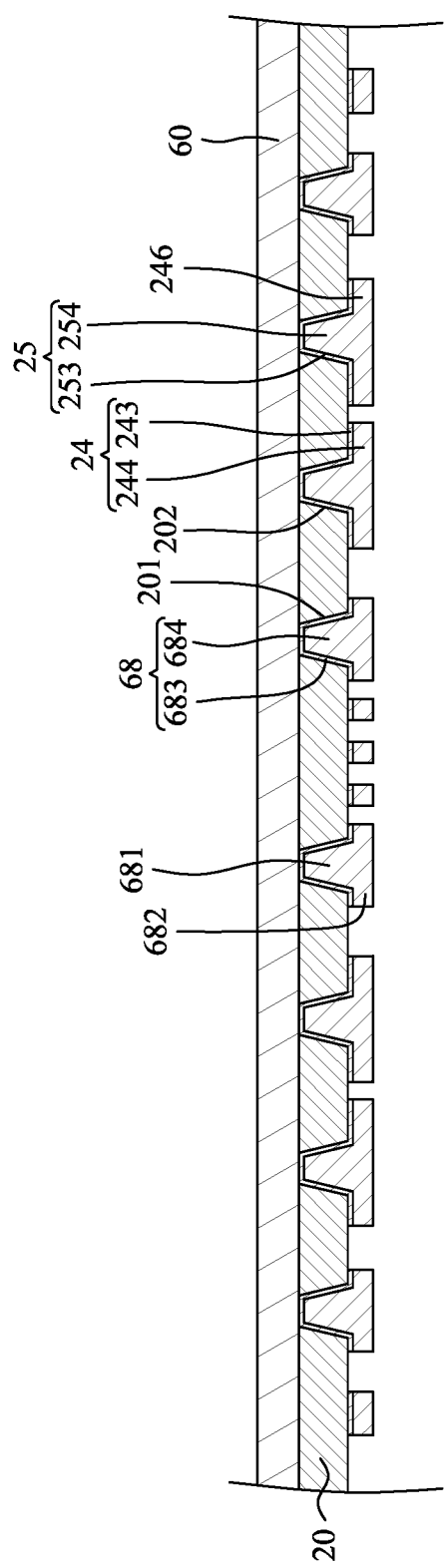
FIG. 15 illustrates one or more stages of an example of a method for manufacturing a wiring structure according to some embodiments of the present disclosure.

Referring to FIG. 15, the first photoresist layer 64 is removed by a stripping technique or other suitable techniques. Then, portions of the seed layer 62 that are not covered by the conductive material 66 are removed by an etching technique or other suitable techniques. Meanwhile, a circuit layer 24, at least one inner conductive via 25 and at least one stacking portion 68 are formed. The circuit layer 24 is disposed on a bottom surface of the first dielectric layer 20, and include a seed layer 243 formed from the seed layer 62 and a conductive material 244 disposed on the seed layer 243 and formed from the conductive material 66. The inner conductive via 25 is disposed in the second opening 202 of the first dielectric layer 20, and includes a seed layer 253 formed from the seed layer 62 and a conductive material 254 disposed on the seed layer 253 and formed from the conductive material 66. The stacking portion 68 is disposed in the first opening 201 of the first dielectric layer 20, and includes a seed layer 693 formed from the seed layer 62 and a conductive material 684 disposed on the seed layer 693 and formed from the conductive material 66. The stacking portion 68 may include a via portion 681 extending through the first dielectric layer 20 and a pad portion 682 on the via portion 681. A shape and a size of the via portion 681 of the stacking portion 68 may be same as a shape and a size of the inner conductive via 25. A shape and a size of the pad portion 682 of the stacking portion 68 may be same as a shape and a size of the pad 246 of the circuit layer 24.

Figure 16:
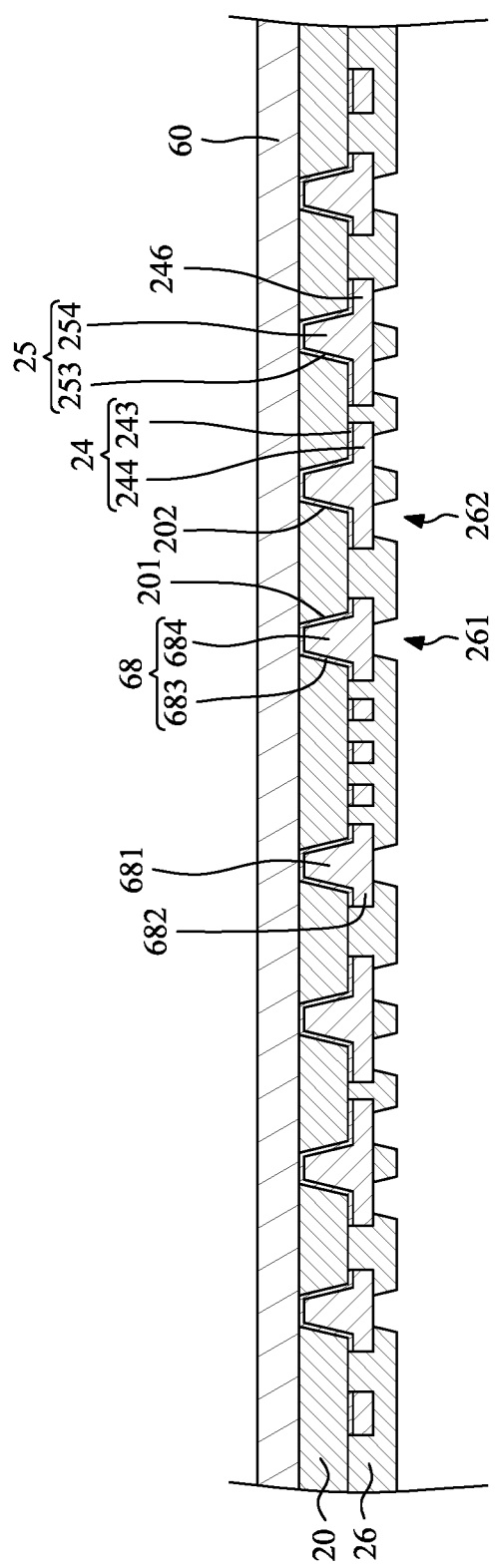
FIG. 16 illustrates one or more stages of an example of a method for manufacturing a wiring structure according to some embodiments of the present disclosure.

Referring to FIG. 16, a patterned second dielectric layer 26 is formed on the first dielectric layer 20 to cover the circuit layer 24 and the stacking portion(s) 68. The patterned second dielectric layer 26 defines at least one first opening 261 and at least one second opening 262 extending through the second dielectric layer 26. The first opening 261 is disposed on the stacking portion 68 so as to expose the pad portion 682 of the stacking portion 68. The second opening 262 is disposed on the circuit layer 24 so as to expose a portion of the circuit layer 24.

Figure 17:
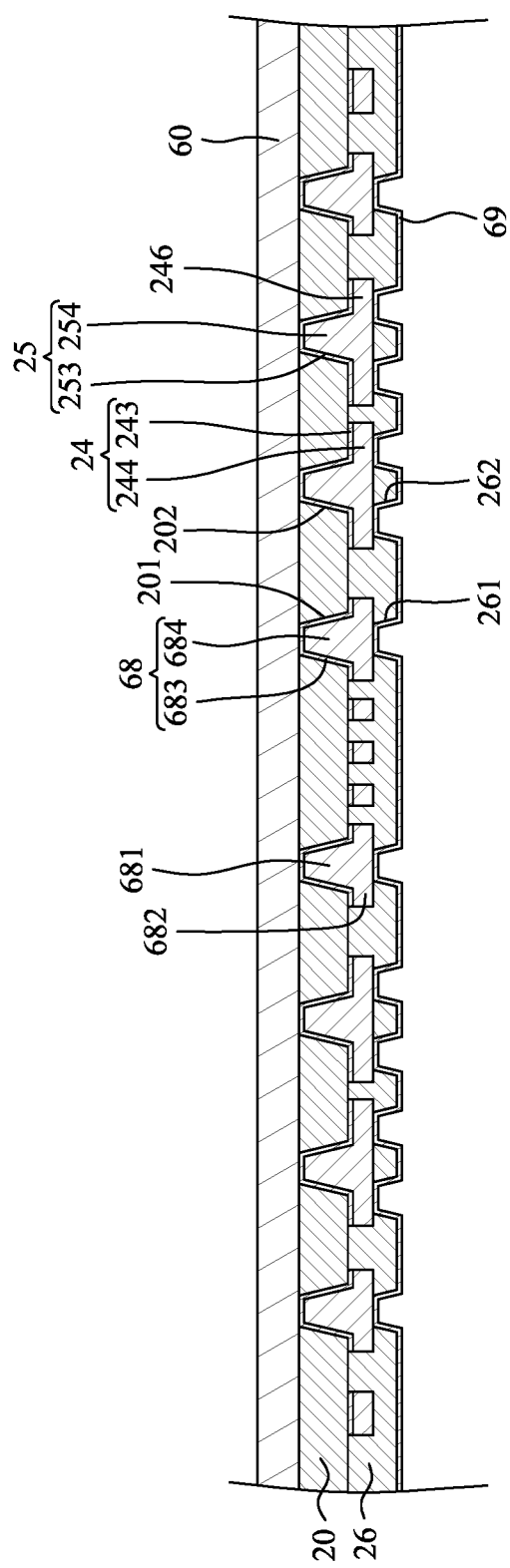
FIG. 17 illustrates one or more stages of an example of a method for manufacturing a wiring structure according to some embodiments of the present disclosure.

Referring to FIG. 17, a seed layer 69 is formed or disposed on the second dielectric layer 26, the first opening 261 and the second opening 262 by a physical vapor deposition (PVD) technique or other suitable techniques.

Figure 18:
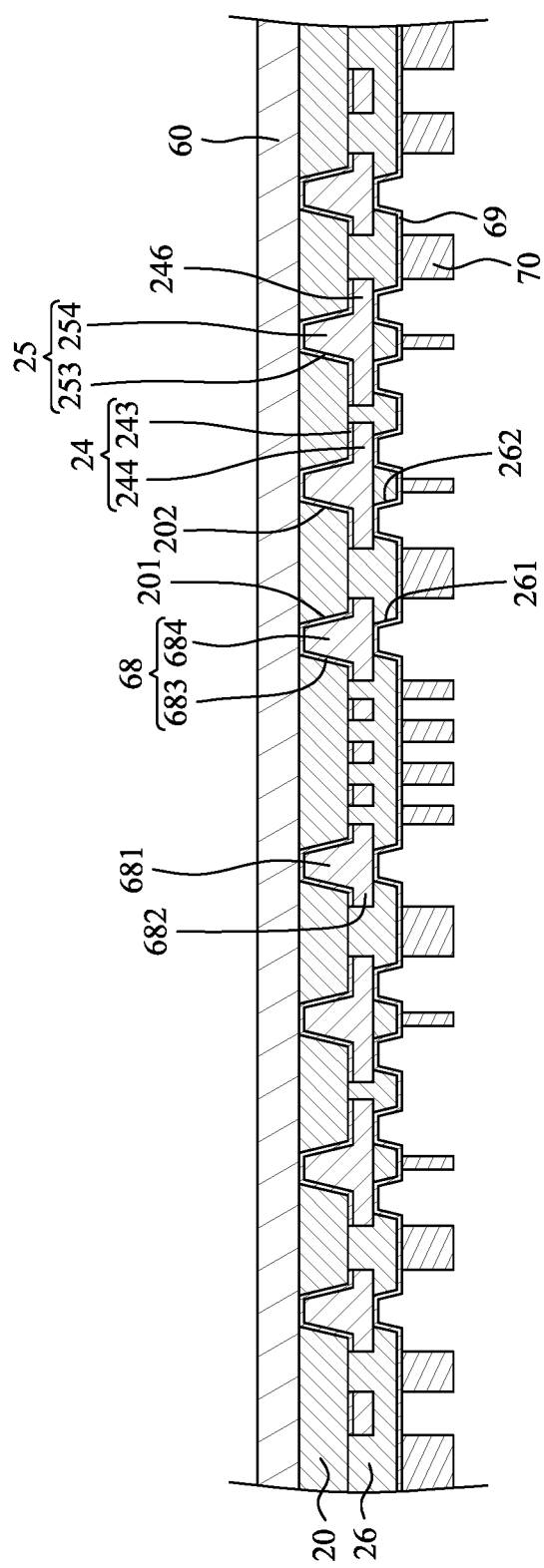
FIG. 18 illustrates one or more stages of an example of a method for manufacturing a wiring structure according to some embodiments of the present disclosure.

Referring to FIG. 18, a second photoresist layer 70 is formed or disposed on the seed layer 69. Then, the second photoresist layer 70 is patterned to form a plurality of openings to expose portions of the seed layer 69 by an exposure and development technique or other suitable techniques.

Figure 19:
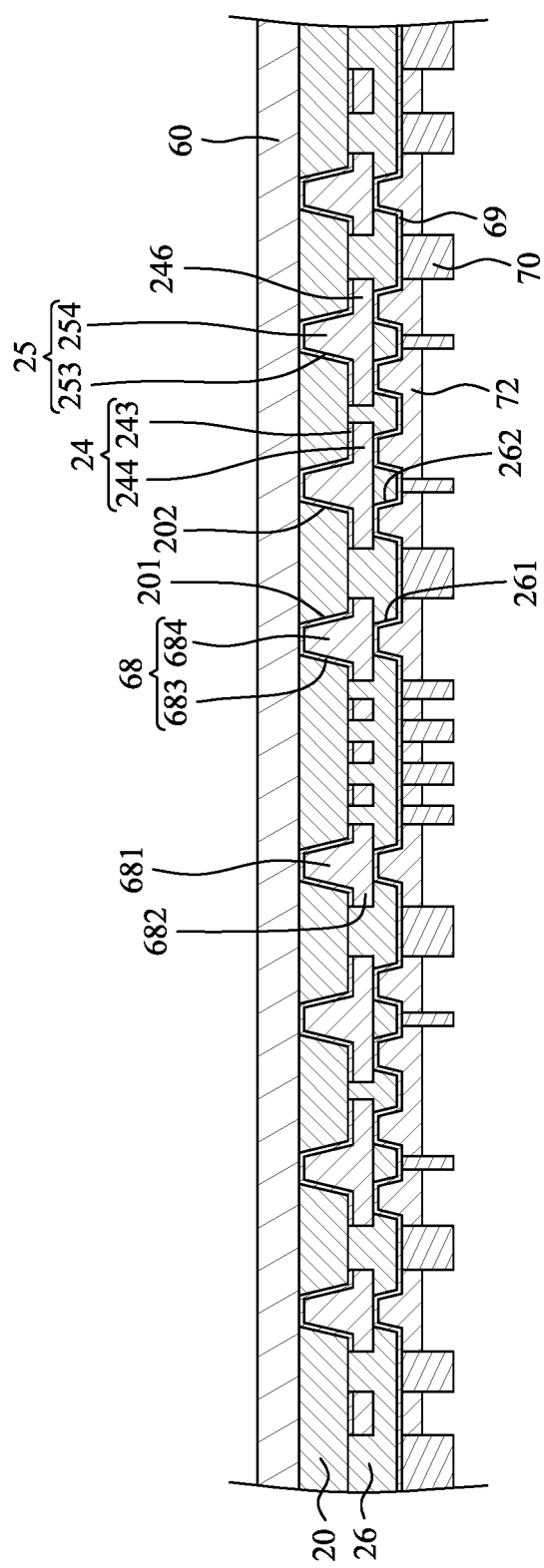
FIG. 19 illustrates one or more stages of an example of a method for manufacturing a wiring structure according to some embodiments of the present disclosure.

Referring to FIG. 19, a conductive material 72 (e.g., a metallic material) is disposed in the openings of the second photoresist layer 70 and on the seed layer 69 by a plating technique or other suitable techniques.

Figure 20:
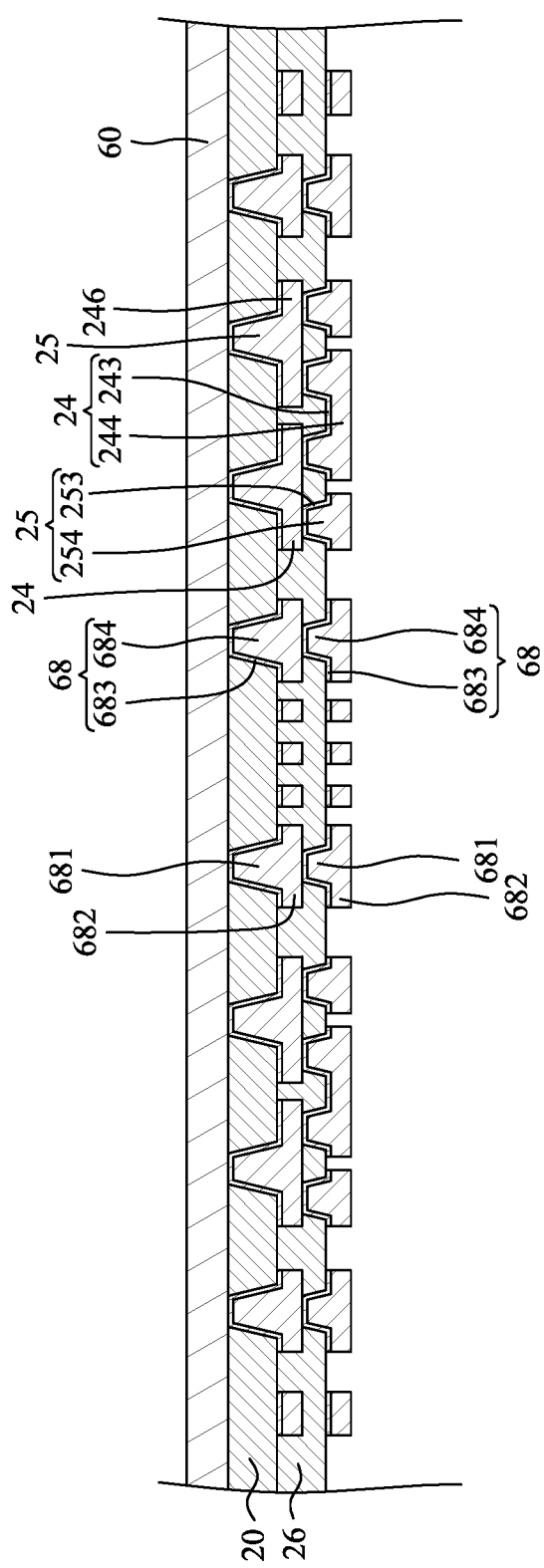
FIG. 20 illustrates one or more stages of an example of a method for manufacturing a wiring structure according to some embodiments of the present disclosure.

Referring to FIG. 20, the second photoresist layer 70 is removed by a stripping technique or other suitable techniques. Then, portions of the seed layer 69 that are not covered by the conductive material 72 are removed by an etching technique or other suitable techniques. Meanwhile, a circuit layer 24, at least one inner conductive via 25 and at least one stacking portion 68 are formed. The circuit layer 24 is disposed on a bottom surface of the second dielectric layer 26, and include a seed layer 243 formed from the seed layer 69 and a conductive material 244 disposed on the seed layer 243 and formed from the conductive material 72. The inner conductive via 25 is disposed in the second opening 262 of the second dielectric layer 26, and includes a seed layer 253 formed from the seed layer 69 and a conductive material 254 disposed on the seed layer 253 and formed from the conductive material 72. The stacking portion 68 is disposed in the first opening 261 of the second dielectric layer 26, and includes a seed layer 693 formed from the seed layer 69 and a conductive material 684 disposed on the seed layer 693 and formed from the conductive material 72. The stacking portion 68 may include a via portion 681 extending through the second dielectric layer 26 and a pad portion 682 on the via portion 681. A shape and a size of the via portion 681 of the stacking portion 68 may be same as a shape and a size of the inner conductive via 25. A shape and a size of the pad portion 682 of the stacking portion 68 may be same as a shape and a size of a pad of the circuit layer 24.

Figure 21:
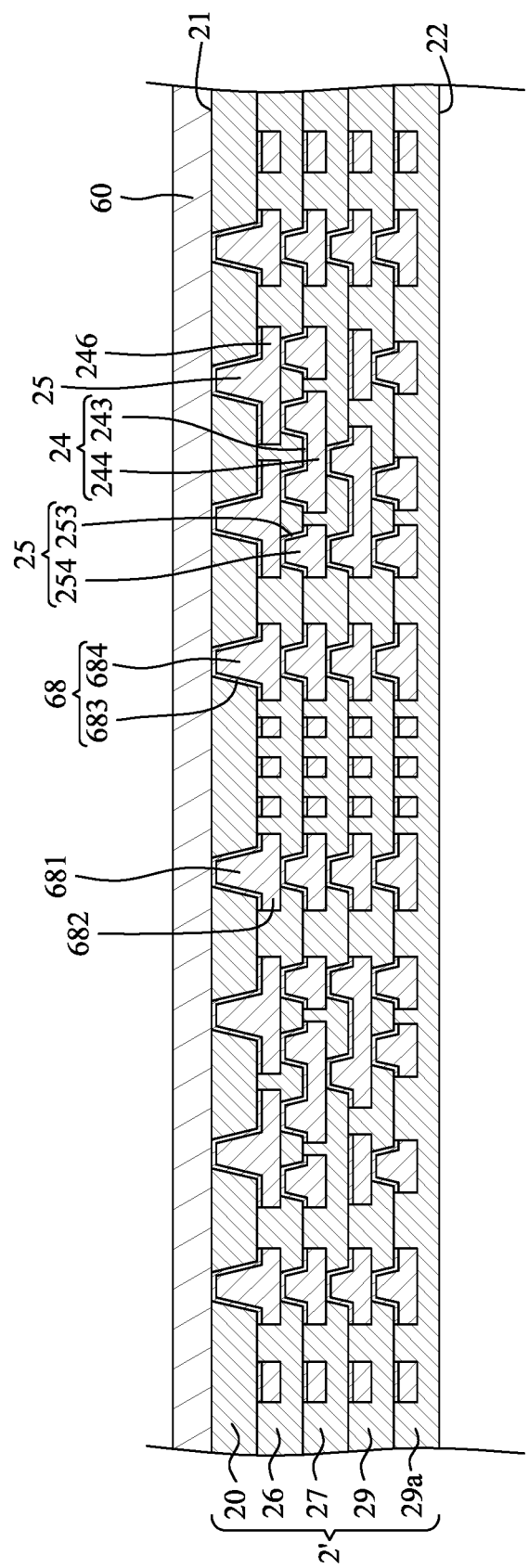
FIG. 21 illustrates one or more stages of an example of a method for manufacturing a wiring structure according to some embodiments of the present disclosure.

Referring to FIG. 21, the stages illustrated in FIG. 16 to FIG. 20 are repeated to form a patterned third dielectric layer 27, a patterned fourth dielectric layer 29, the circuit layers 24 on the dielectric layers 27, 29, the inner conductive via 25 extending through the dielectric layers 27, 29, and the stacking portions 68 embedded in the dielectric layers 27, 29. Then, a fifth dielectric layer 29a is formed or disposed to cover the patterned fourth dielectric layer 29, the circuit layer 24 and the stacking portion 68. In some embodiments, the stacking portions 68 in different dielectric layers may be arranged substantially in a row, and may be aligned with one another. In addition, the stacking portions 68 may connect one another or may be stacked with one another.

Meanwhile, an upper conductive structure 2' is formed on the carrier 60. The upper conductive structure 2' may be tested.

Figure 22:
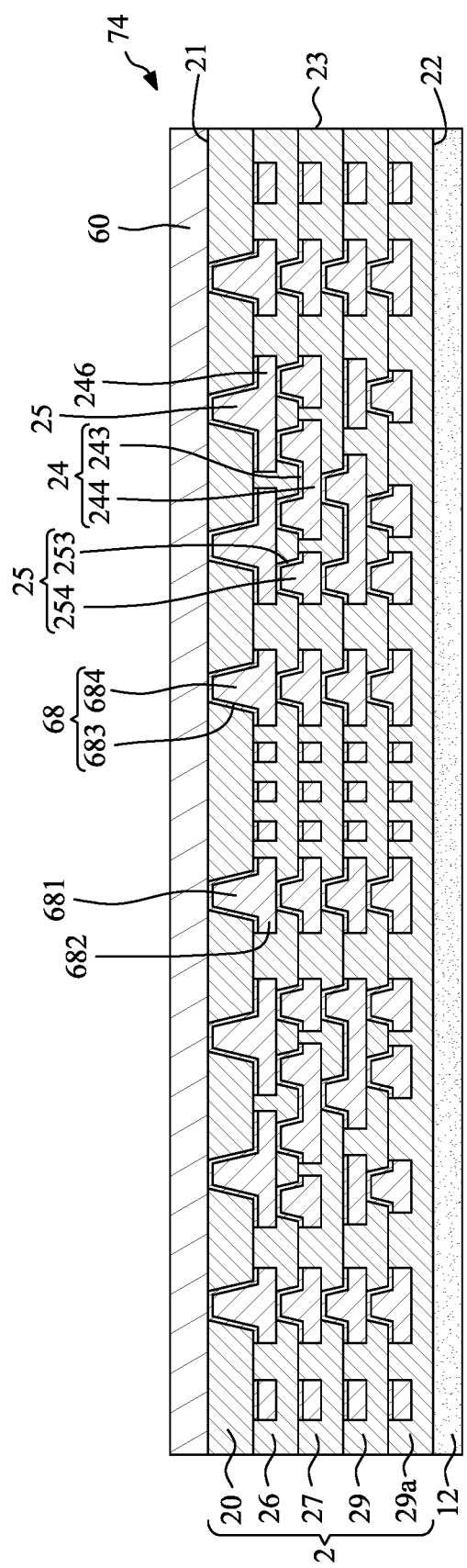
FIG. 22 illustrates one or more stages of an example of a method for manufacturing a wiring structure according to some embodiments of the present disclosure.

Referring to FIG. 22, the upper conductive structure 2' and the carrier 60 are cut to form a plurality of unit structures 74. The unit structure 74 includes an upper conductive structure 2 and a portion of the carrier 60. The upper conductive structure 2 of FIG. 22 may be the upper conductive structure 2 of FIG. 1. Then, an adhesive layer 12 is formed or applied on the bottom surface 22 of the upper conductive structure 2 (e.g., the bottom surface of the fifth dielectric layer 29a).

Figure 23:
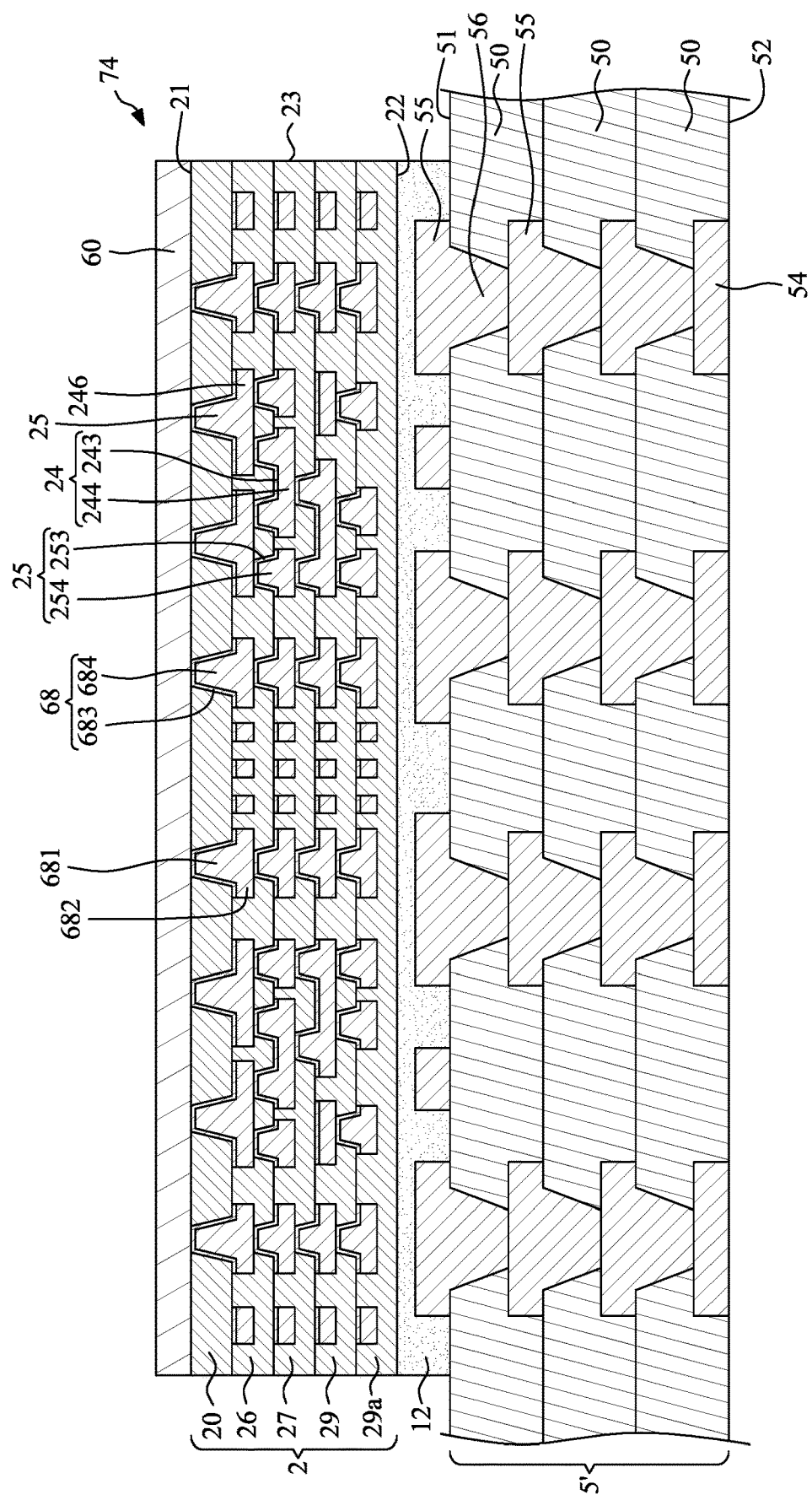
FIG. 23 illustrates one or more stages of an example of a method for manufacturing a wiring structure according to some embodiments of the present disclosure.

Referring to FIG. 23, the unit structure 74 is attached to the lower conductive structure 5' of FIG. 10. The upper conductive structure 2 faces the lower conductive structure 5'. Thus, the upper conductive structure 2 and the carrier 60 are attached to the lower conductive structure 5' through the adhesive layer 12. Then, the adhesive layer 12 is cured to form an intermediate layer 12.

Referring to FIG. 24, the carrier 60 is removed.

Figure 25:
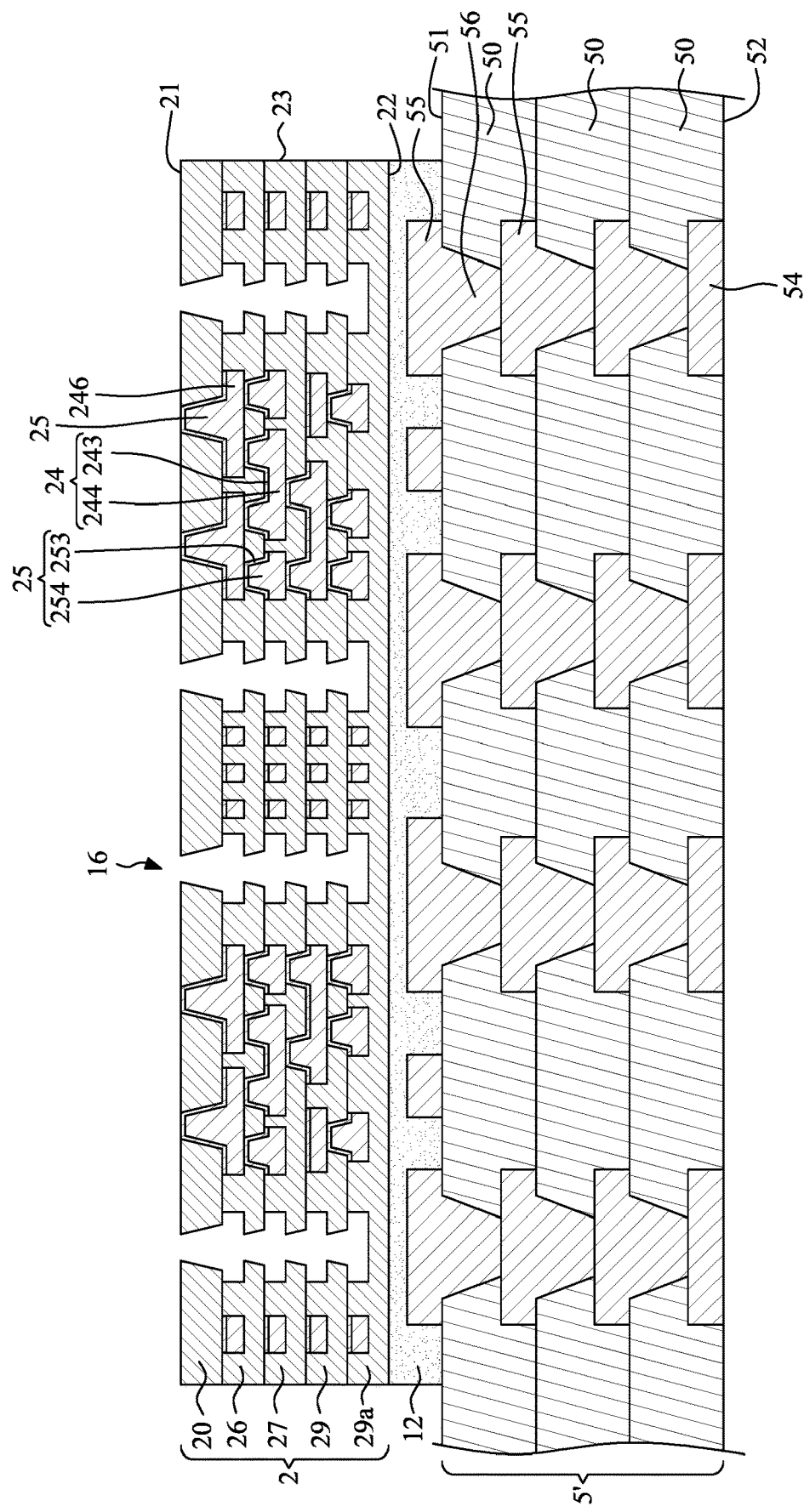
FIG. 25 illustrates one or more stages of an example of a method for manufacturing a wiring structure according to some embodiments of the present disclosure.

Referring to FIG. 25, the stacking portions 68 are removed to form at least one accommodating hole 16 through wet etching.

Figure 26:
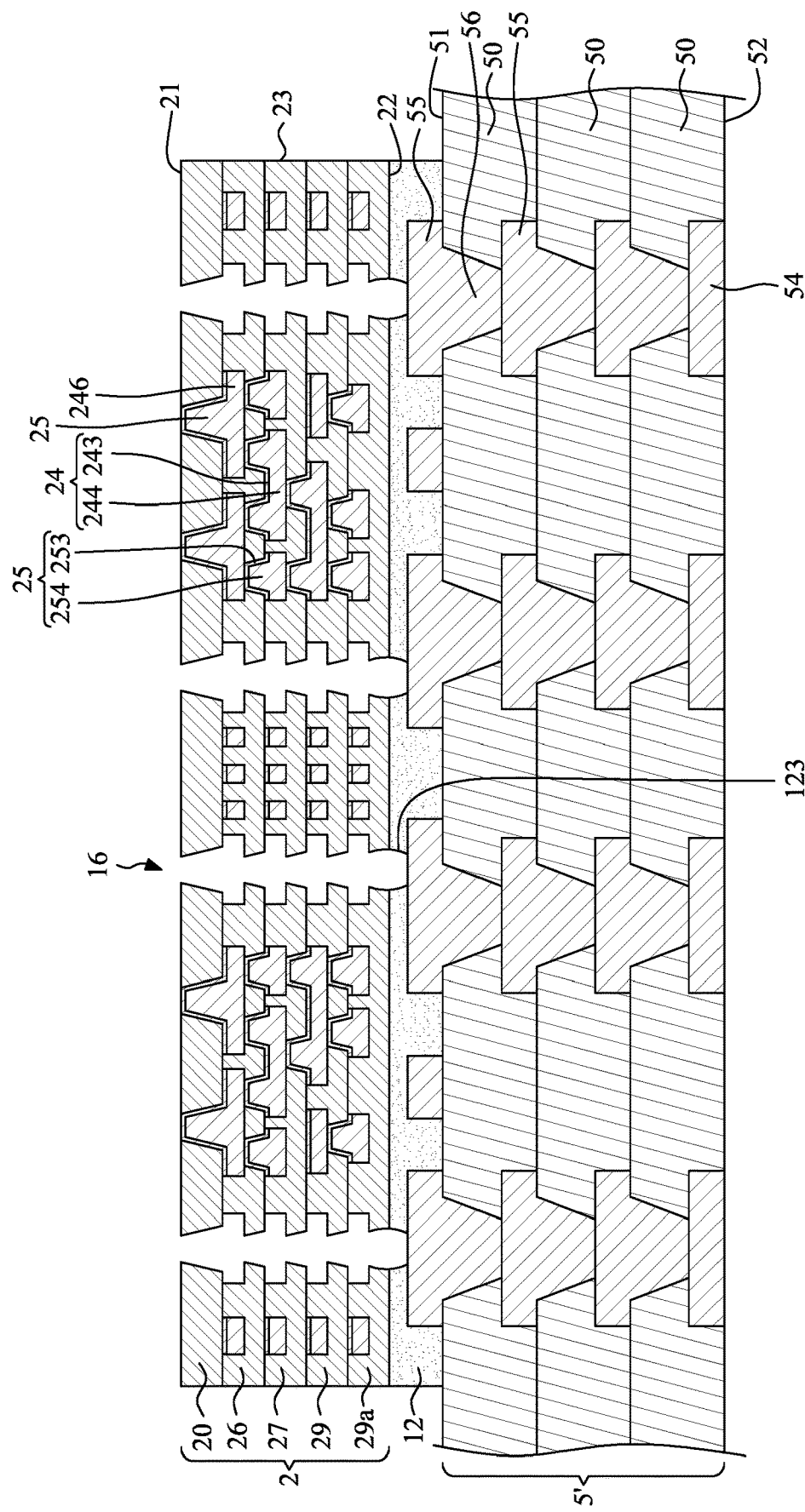
FIG. 26 illustrates one or more stages of an example of a method for manufacturing a wiring structure according to some embodiments of the present disclosure.

Referring to FIG. 26, a portion of the fifth dielectric layer 29a and a portion of the intermediate layer 12 under the accommodating hole 16 are removed through laser drilling or plasma etching to form a through hole 123. Thus, the through hole 123 extends through the fifth dielectric layer 29a and the intermediate layer 12, and terminates at or on a topmost upper circuit layer 55 of the lower conductive structure 5'. The through hole 123 may expose a portion of the topmost upper circuit layer 55 of the lower conductive structure 5'. The through hole 123 may be aligned with and in communication with the accommodating hole 16 of the upper conductive structure 2. In some embodiments, the through hole 123 may be a portion of the accommodating hole 16.

Figure 27:
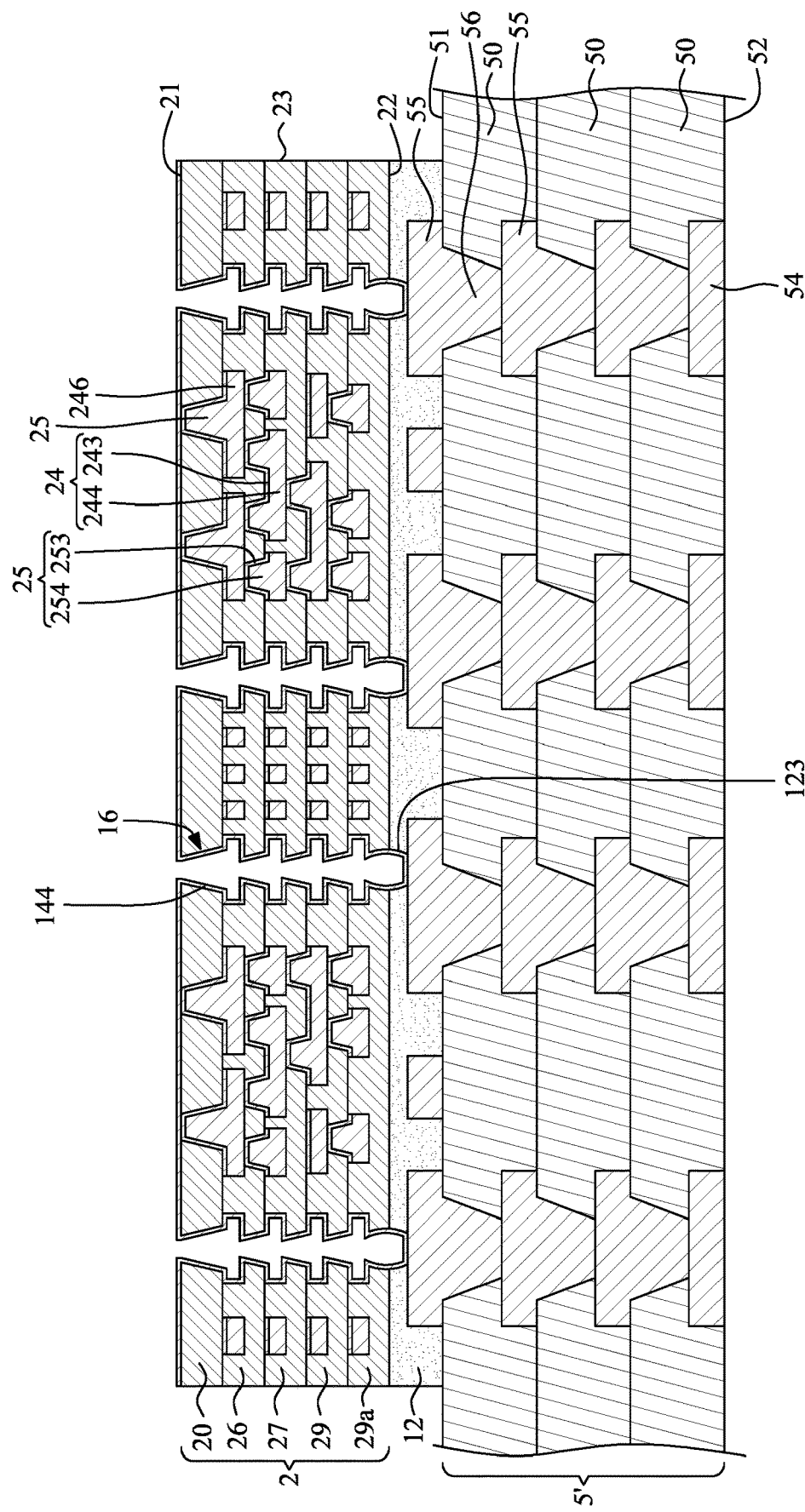
FIG. 27 illustrates one or more stages of an example of a method for manufacturing a wiring structure according to some embodiments of the present disclosure.

Referring to FIG. 27, a seed layer 144 is formed or disposed on the top surface 21 of the upper conductive structure 2 and in the accommodating hole 16 and the through hole 123.

Figure 28:
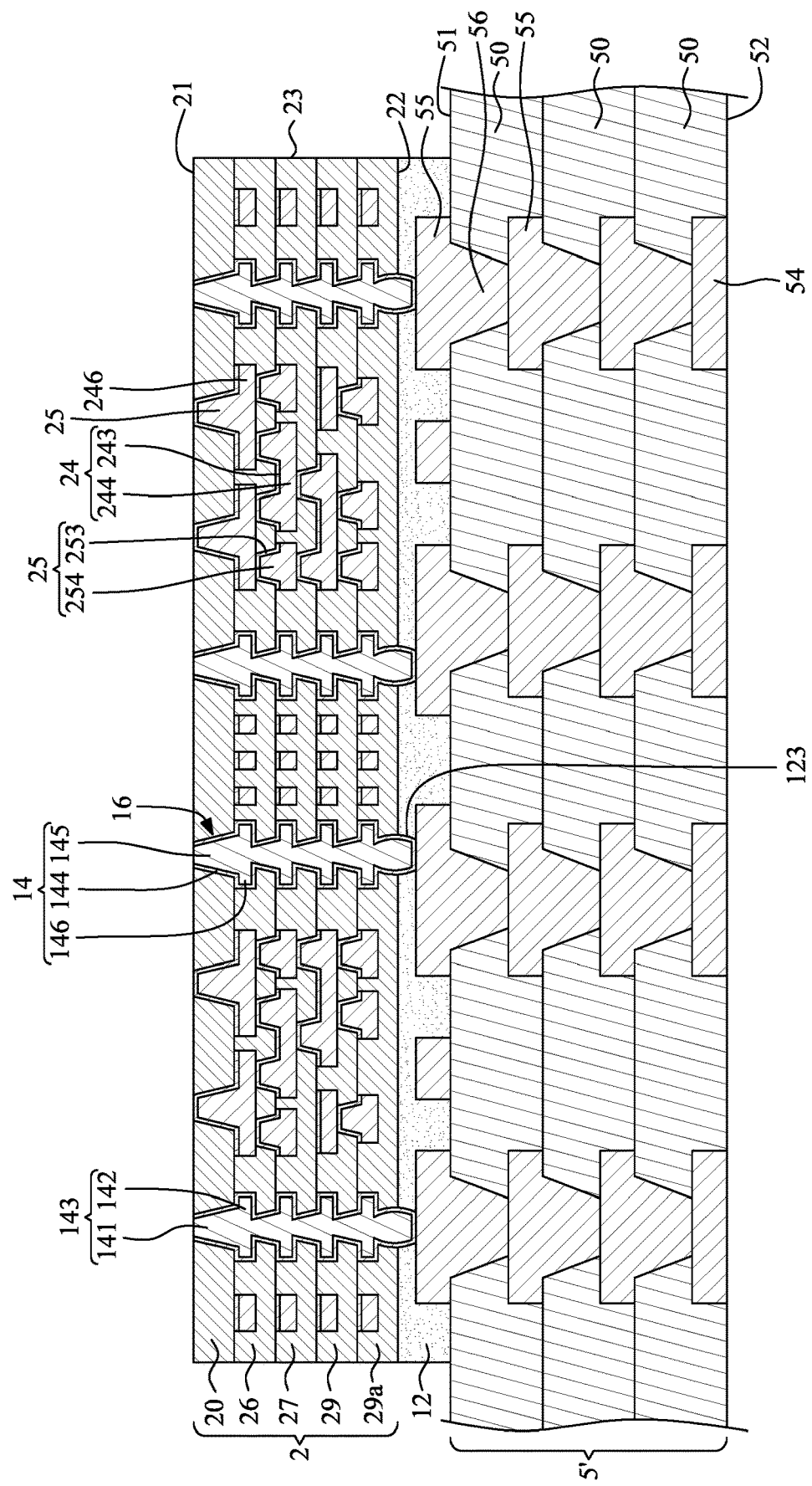
FIG. 28 illustrates one or more stages of an example of a method for manufacturing a wiring structure according to some embodiments of the present disclosure.

Referring to FIG. 28, a conductive material (e.g., a metallic material) is formed or disposed to fill the accommodating hole 16 and the through hole 123 through, for example, plating, so as to form a conductive through via 14 in the accommodating hole 16 and the through hole 123. The conductive through via 14 extends through the upper conductive structure 2 and the intermediate layer 12, and contacts a portion of the topmost upper circuit layer 55 of the lower conductive structure 5'. The conductive through via 14 includes plurality of unit portions 143. A shape and a size of each of the unit portions 143 may be same as a shape and a size of each of the stacking portions 68.

Then, the lower conductive structure 5' is singulated so as to obtain the wiring structure 1 of FIG. 1.

Since a width and a profile of the accommodating hole 16 are defined and limited by the stacking portions 68. As a result, a width of the accommodating hole 16 may be relatively small, and the accommodating hole 16 may not have a barrel shape. Accordingly, the width of the conductive through via 14 may be relatively small, and the conductive through via 14 may not have a barrel shape.

Figure 29:
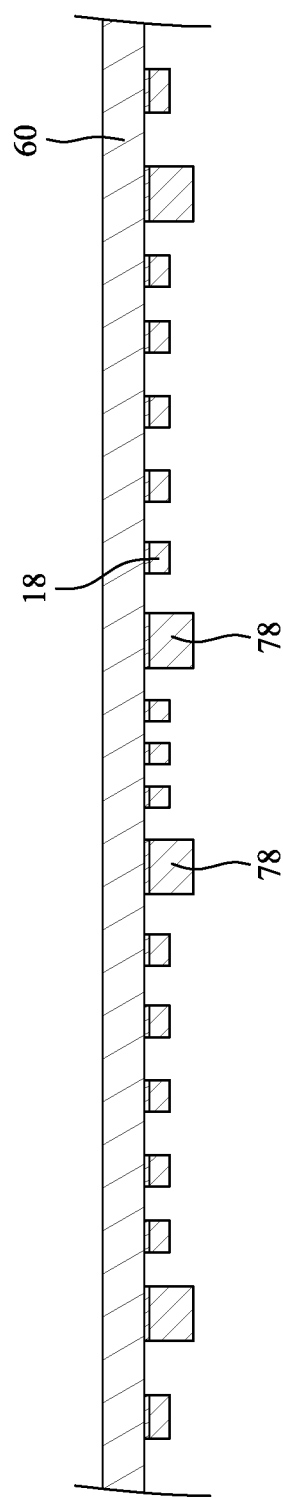
FIG. 29 illustrates one or more stages of an example of a method for manufacturing wiring structure according to some embodiments of the present disclosure.

FIG. 29 through FIG. 42 illustrate a method for manufacturing a wiring structure according to some embodiments of the present disclosure. In some embodiments, the method is for manufacturing the wiring structure 1c shown in FIG. 5. The initial stages of the illustrated process are the same as, or similar to, the stage illustrated in FIG. 10. FIG. 29 depicts a stage subsequent to that depicted in FIG. 10.

Referring to FIG. 29, an outer circuit layer 18 and a plurality of stacking portions 78 are formed on a carrier 60. A thickness of the stacking portion 78 is greater than a thickness of the outer circuit layer 18.

Figure 30:
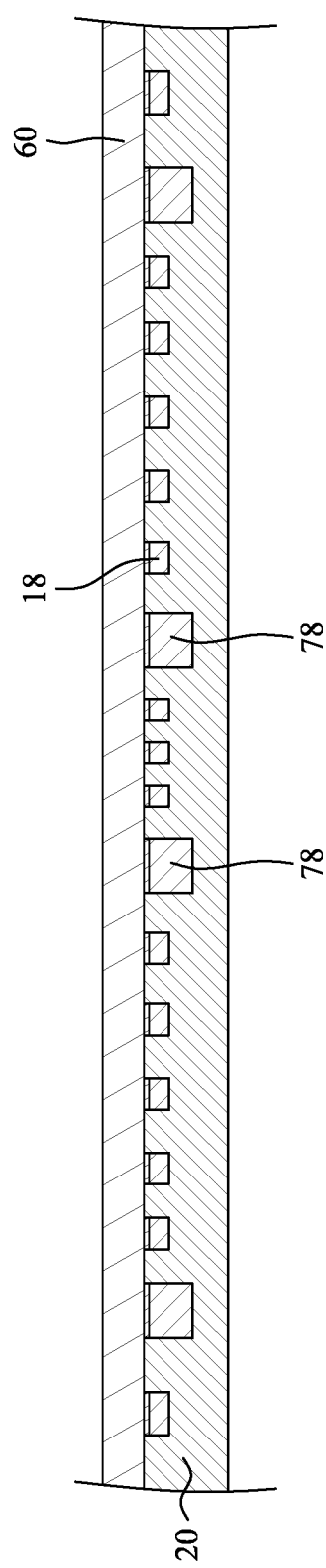
FIG. 30 illustrates one or more stages of an example of a method for manufacturing a wiring structure according to some embodiments of the present disclosure.

Referring to FIG. 30, a first dielectric layer 20 is formed or disposed on the carrier 60 to cover the outer circuit layer 18 and the stacking portions 78. A thickness of the first dielectric layer 20 may be greater than the thickness of the stacking portion 78.

Figure 31:
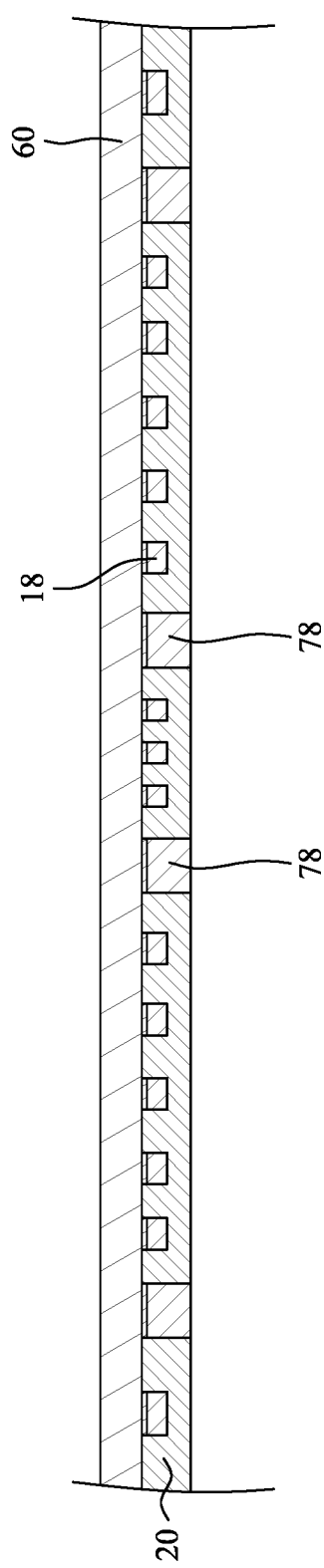
FIG. 31 illustrates one or more stages of an example of a method for manufacturing a wiring structure according to some embodiments of the present disclosure.

Referring to FIG. 31, the first dielectric layer 20 is thinned by, for example, grinding, to expose the stacking portions 78. Thus, a thickness of the stacking portion 78 is substantially equal to a thickness of a respective one of the dielectric layers (e.g., the first dielectric layer 20).

Figure 32:
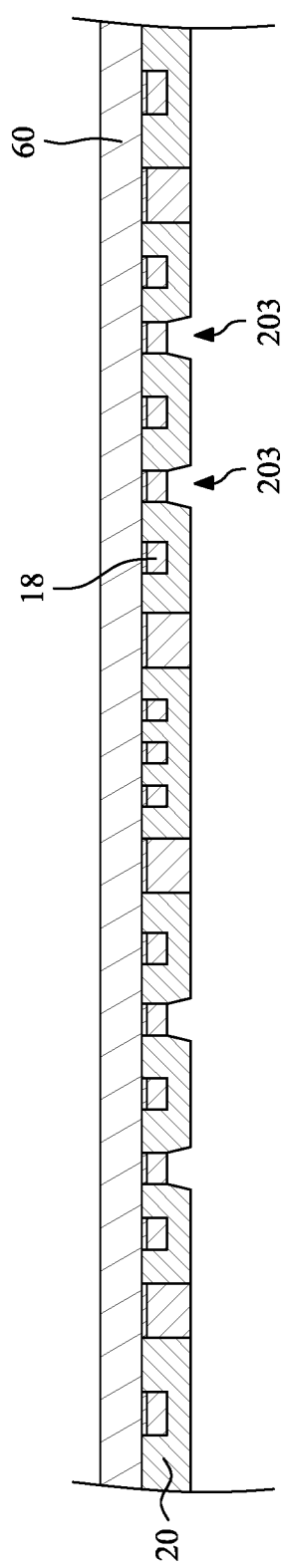
FIG. 32 illustrates one or more stages of an example of a method for manufacturing a wiring structure according to some embodiments of the present disclosure.

Referring to FIG. 32, the first dielectric layer 20 is patterned to form a plurality of openings 203 to expose portions of the outer circuit layer 18 by an exposure and development technique or other suitable techniques.

Figure 33:
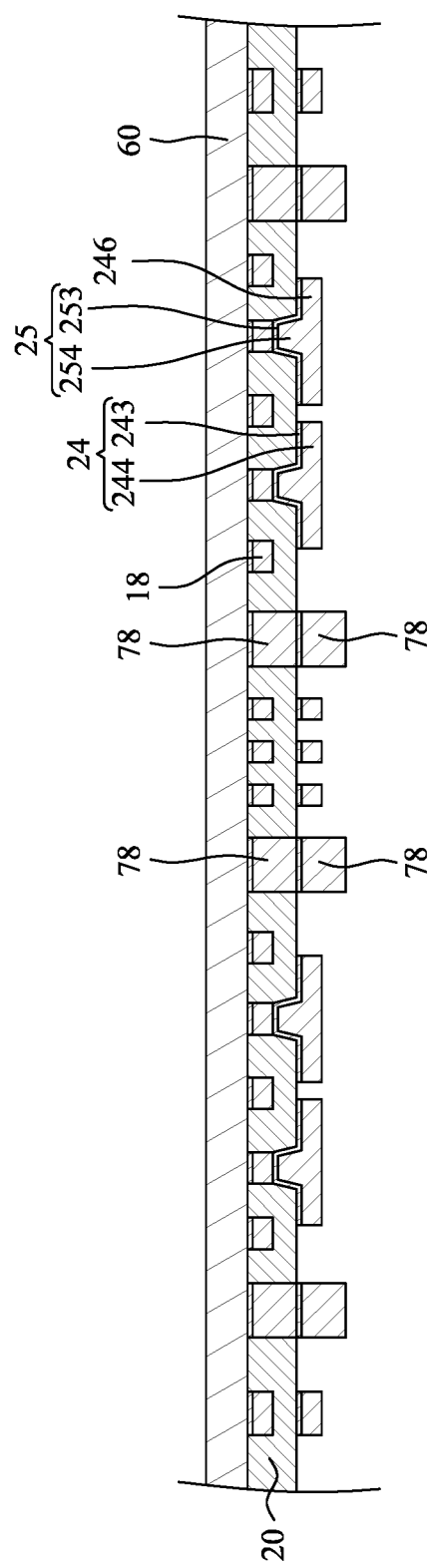
FIG. 33 illustrates one or more stages of an example of a method for manufacturing a wiring structure according to some embodiments of the present disclosure.

Referring to FIG. 33, a circuit layer 24, a plurality of inner conductive vias 25 and at least one stacking portion 78 are formed. The circuit layer 24 and the stacking portion 78 are formed on the first dielectric layer 20. A thickness of the stacking portion 78 is greater than a thickness of the circuit layer 24. The inner conductive vias 25 are formed in the openings 203 of the first dielectric layer 20 to contact the exposed portions of outer circuit layer 18.

Figure 34:
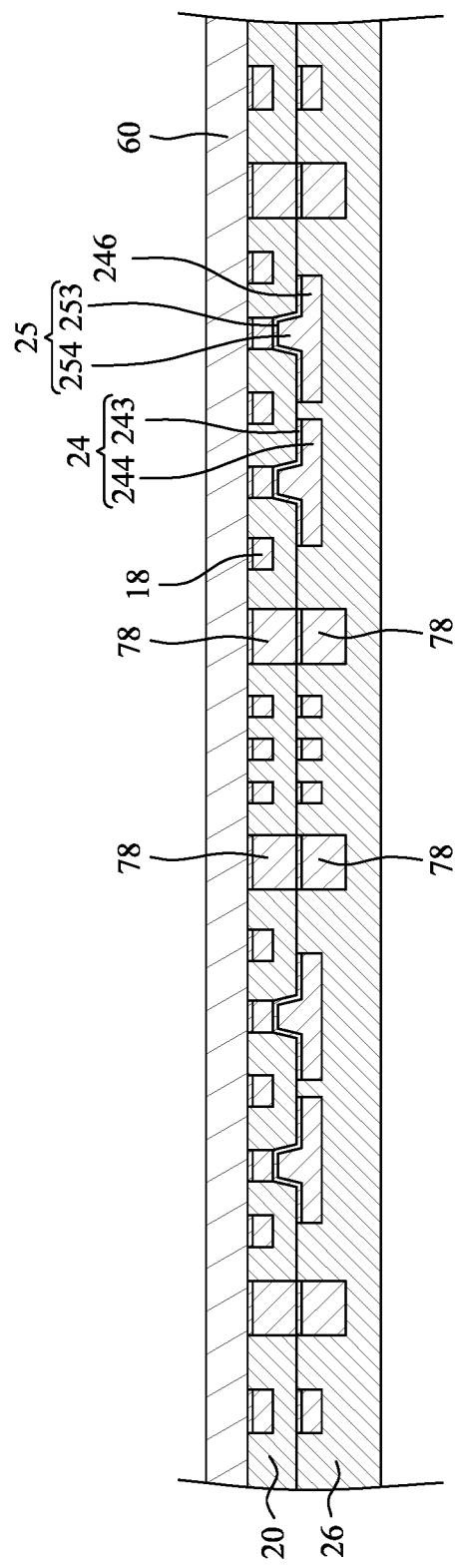
FIG. 34 illustrates one or more stages of an example of a method for manufacturing a wiring structure according to some embodiments of the present disclosure.

Referring to FIG. 34, a second dielectric layer 26 is formed or disposed on the first dielectric layer 20 to cover the circuit layer 24 and the stacking portions 78. A thickness of the second dielectric layer 26 may be greater than the thickness of the stacking portion 78.

Figure 35:
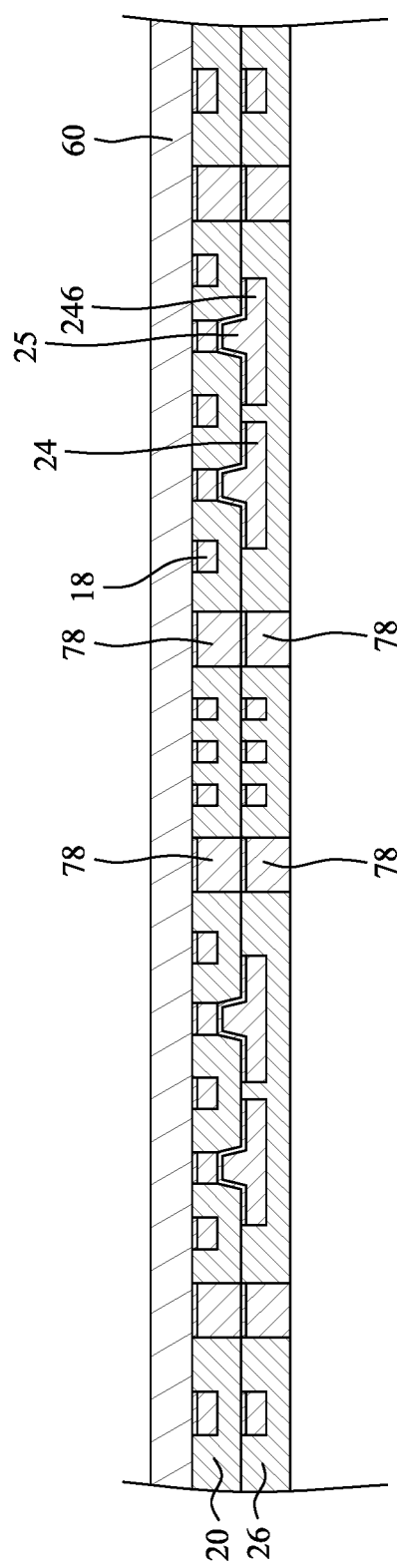
FIG. 35 illustrates one or more stages of an example of a method for manufacturing a wiring structure according to some embodiments of the present disclosure.

Referring to FIG. 35, the second dielectric layer 26 is thinned by, for example, grinding, to expose the stacking portions 78. Thus, a thickness of the stacking portion 78 is substantially equal to a thickness of a respective one of the dielectric layers (e.g., the second dielectric layer 26).

Figure 36:
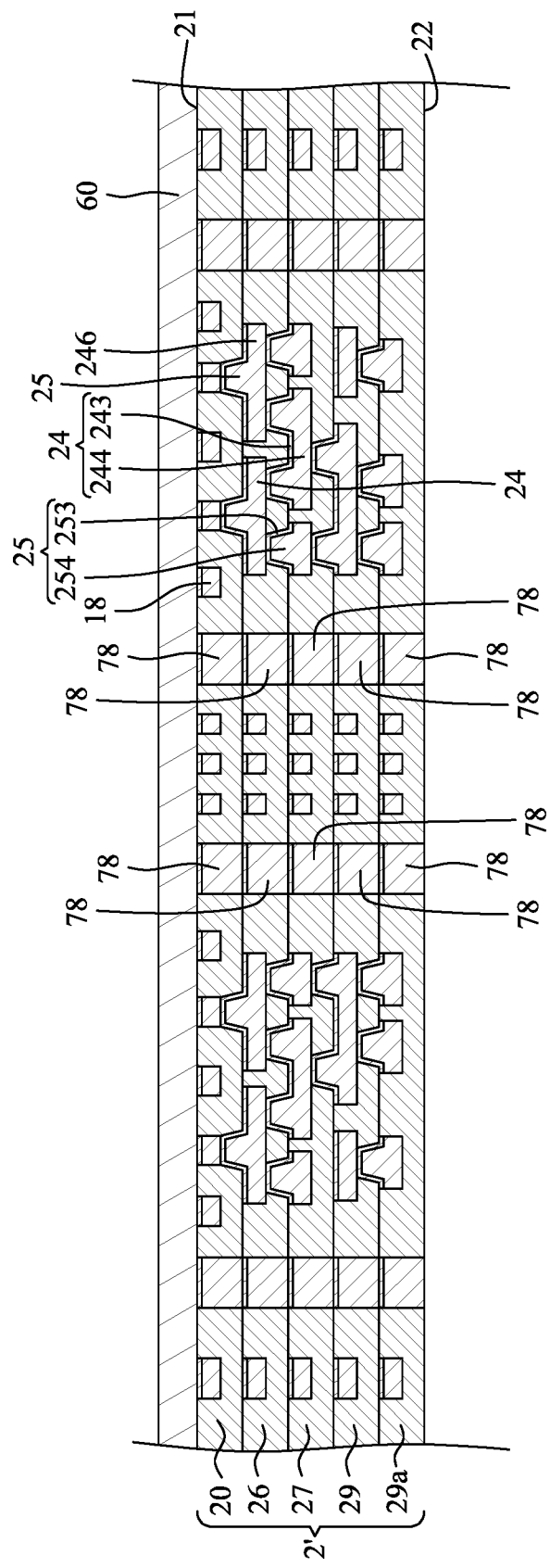
FIG. 36 illustrates one or more stages of an example of a method for manufacturing a wiring structure according to some embodiments of the present disclosure.

Referring to FIG. 36, the stages illustrated in FIG. 32 to FIG. 35 are repeated to form a third dielectric layer 27, a fourth dielectric layer 29, a fifth dielectric layer 29a, the circuit layers 24 on the dielectric layers 26, 27, 29, the inner conductive via 25 extending through the dielectric layers 26, 27, 29, and the stacking portions 78 embedded in the dielectric layers 26, 27, 29, 29a. In some embodiments, the stacking portions 78 in different dielectric layers 20, 26, 27, 29, 29a. may be arranged substantially in a row, and may be aligned with one another. In addition, the stacking portions 78 may connect one another or may be stacked with one another.

Meanwhile, an upper conductive structure 2' is formed on the carrier 60. The upper conductive structure 2' may be tested.

Figure 37:
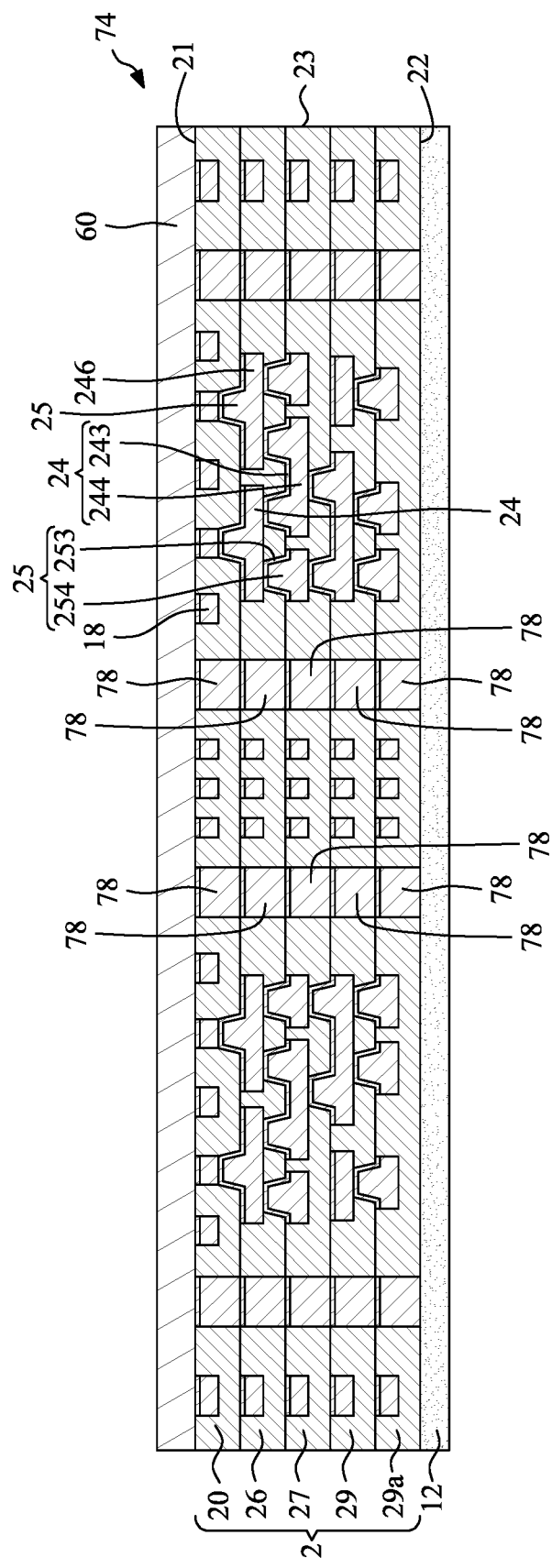
FIG. 37 illustrates one or more stages of an example of a method for manufacturing a wiring structure according to some embodiments of the present disclosure.

Referring to FIG. 37, the upper conductive structure 2' and the carrier 60 are cut to form a plurality of unit structures 74. The unit structure 74 includes an upper conductive structure 2 and a portion of the carrier 60. Then, an adhesive layer 12 is formed or applied on the bottom surface 22 of the upper conductive structure 2.

Figure 38:
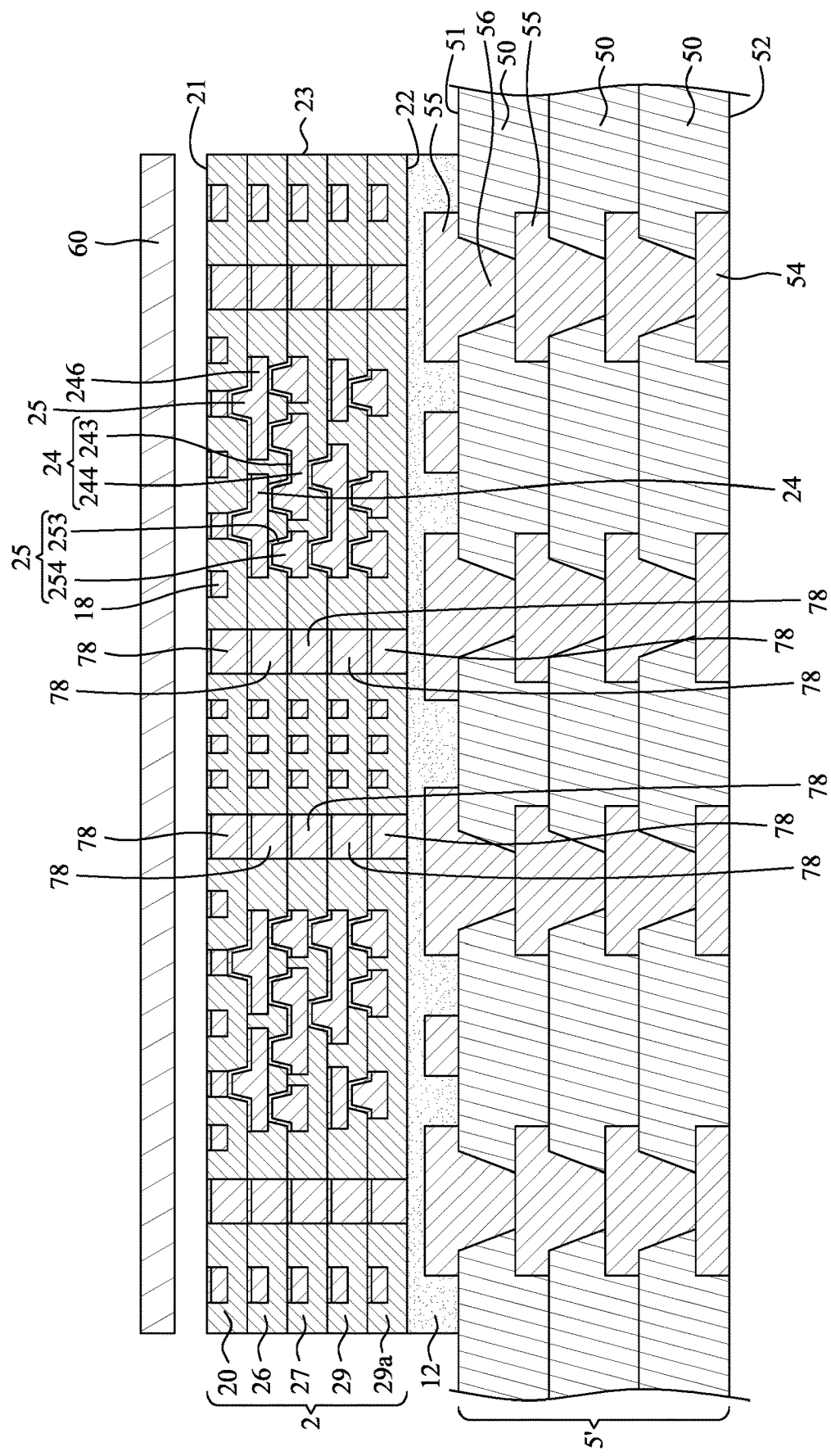
FIG. 38 illustrates one or more stages of an example of a method for manufacturing a wiring structure according to some embodiments of the present disclosure.

Referring to FIG. 38, the unit structure 74 is attached to the lower conductive structure 5' of FIG. 10 through the adhesive layer 12. Then, the adhesive layer 12 is cured to form an intermediate layer 12. Then, the carrier 60 is removed.

Figure 39:
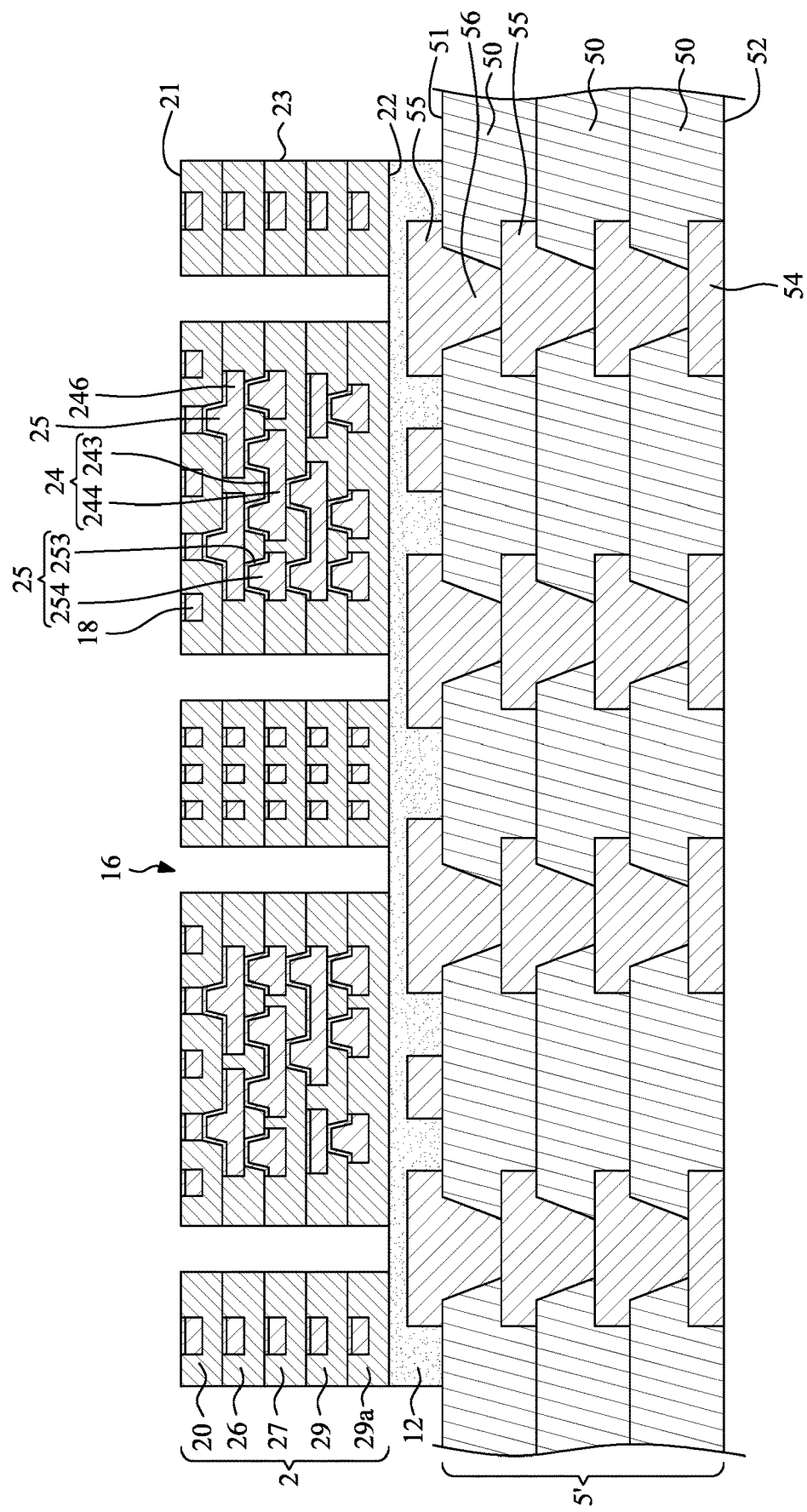
FIG. 39 illustrates one or more stages of an example of a method for manufacturing wiring structure according to some embodiments of the present disclosure.

Referring to FIG. 39, the stacking portions 78 are removed to form at least one accommodating hole 16 through wet etching.

Figure 40:
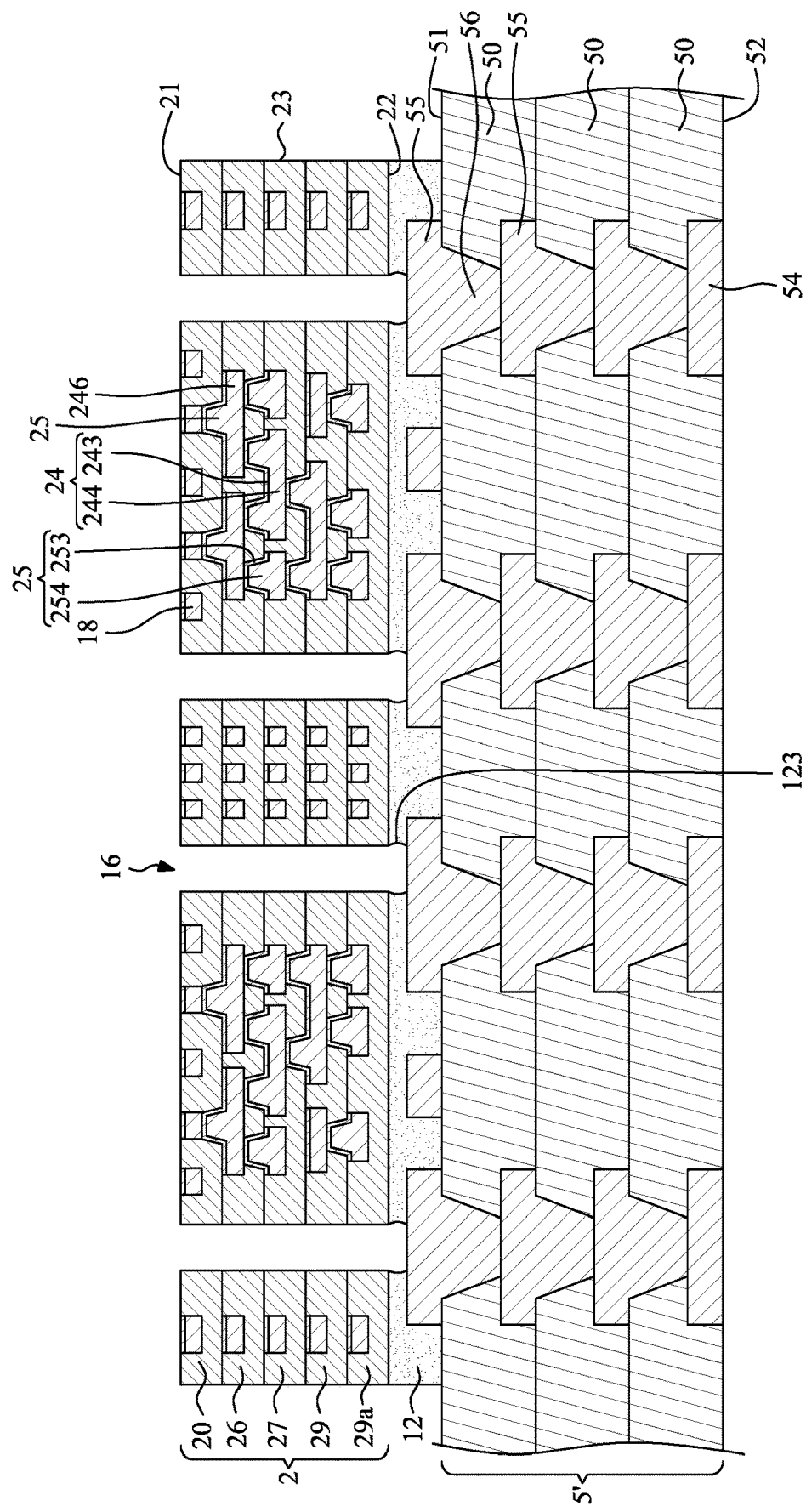
FIG. 40 illustrates one or more stages of an example of a method for manufacturing a wiring structure according to some embodiments of the present disclosure.

Referring to FIG. 40, a portion of the intermediate layer 12 under the accommodating hole 16 are removed through laser drilling or plasma etching to form a through hole 123. Thus, the through hole 123 extends through the intermediate layer 12 to expose a portion of the topmost upper circuit layer 55 of the lower conductive structure 5'. In some embodiments, the through hole 123 may be a portion of the accommodating hole 16.

Figure 41:
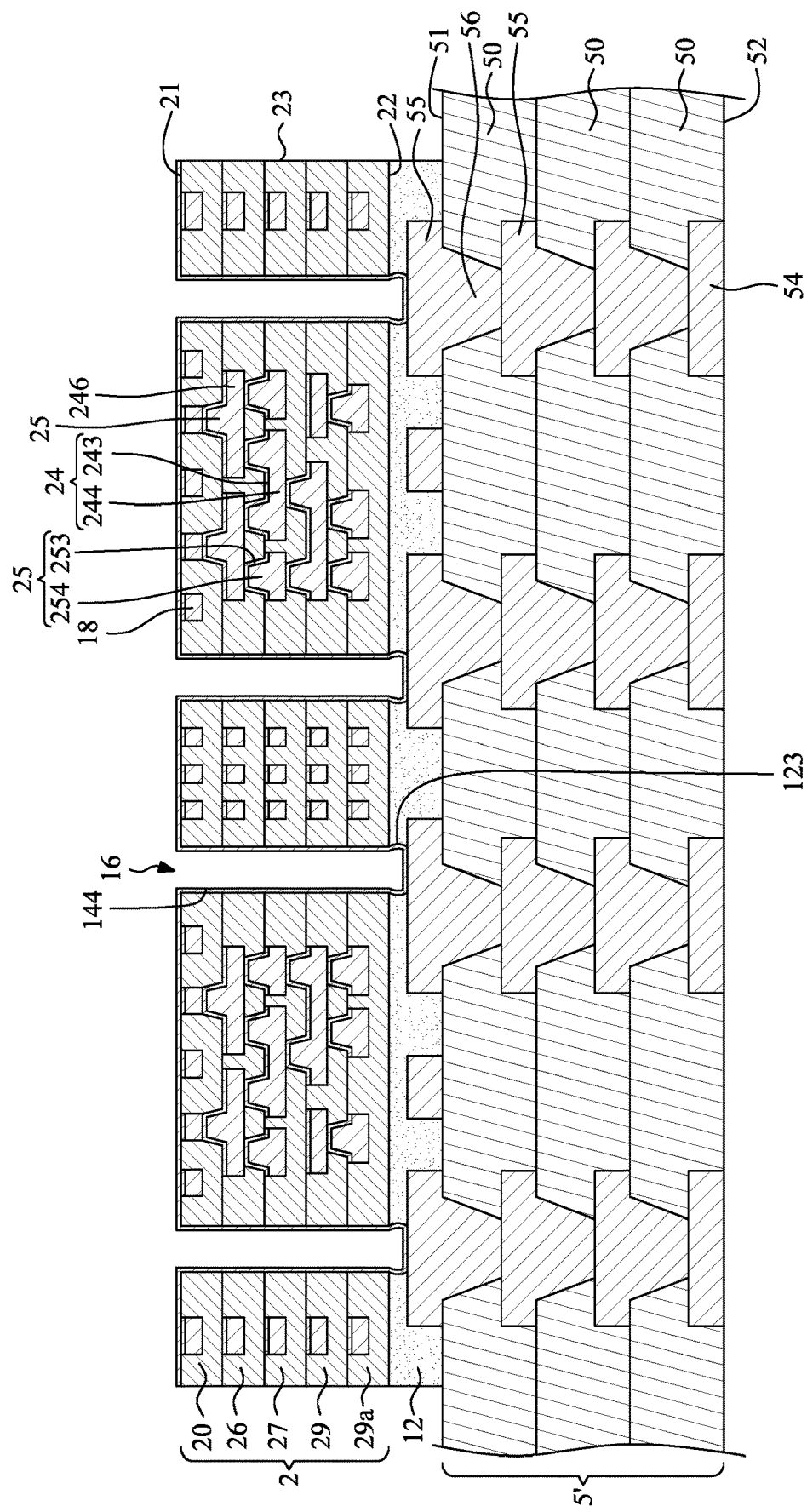
FIG. 41 illustrates one or more stages of an example of a method for manufacturing a wiring structure according to some embodiments of the present disclosure.

Referring to FIG. 41, a seed layer 144 is formed or disposed on the top surface 21 of the upper conductive structure 2 and in the accommodating hole 16 and the through hole 123.

Figure 42:
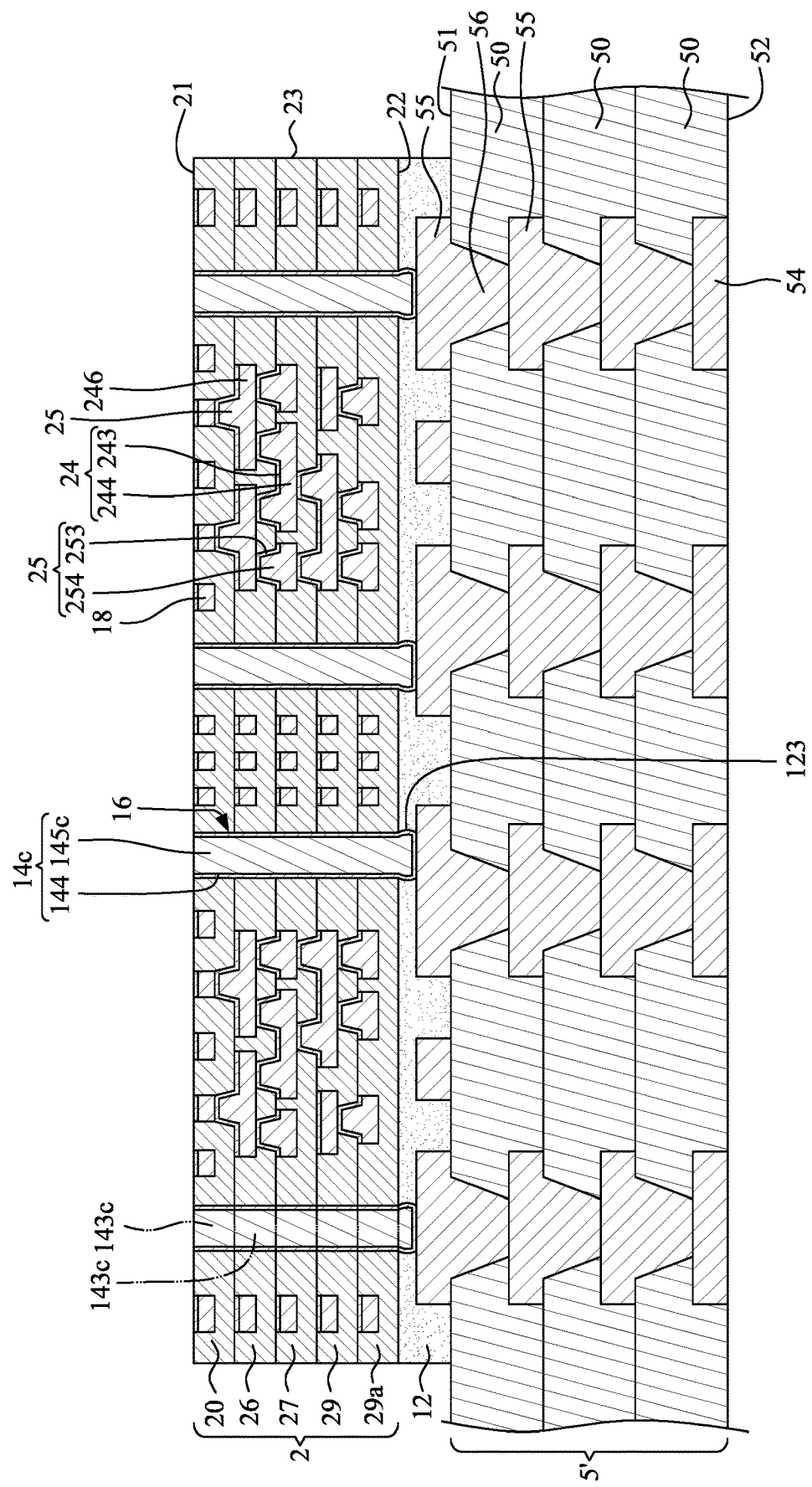
FIG. 42 illustrates one or more stages of an example of a method for manufacturing a wiring structure according to some embodiments of the present disclosure.

Referring to FIG. 42, a conductive material (e.g., a metallic material) is formed or disposed to fill the accommodating hole 16 and the through hole 123 through, for example, plating, so as to form a conductive through via 14c in the accommodating hole 16 and the through hole 123. The conductive through via 14c includes plurality of unit portions 143c. A shape and a size of each of the unit portions 143c may be same as a shape and a size of each of the stacking portions 78.

Then, the lower conductive structure 5' is singulated so as to obtain the wiring structure 1c of FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A wiring structure, comprising:
   a conductive structure including a plurality of dielectric layers and a plurality of circuit layers in contact with the dielectric layers;
   at least one conductive through via extending through the conductive structure, wherein the conductive through via is a monolithic structure and includes a main portion and an extending portion protruding from the main portion, the conductive through via further includes a plurality of unit portions embedded in a respective one of the dielectric layers, at least one of the unit portions includes a first portion embedded in an upper dielectric layer and a second portion embedded in a lower dielectric layer under the upper dielectric layer, and a shape of the first portion is different from a shape of the second portion; and
   a plurality of inner conductive vias disposed between two adjacent ones of the circuit layers for electrically connecting the two adjacent ones of the circuit layers, wherein the circuit layer includes a plurality of pads connecting the inner conductive via, a shape of the first portion of the unit portion is substantially same as a shape of the inner conductive via, and a shape of the second portion of the unit portion is substantially same as a shape of the pad of the circuit layer.

2. The wiring structure of claim 1, wherein the first portions of the unit portions taper along a same direction and form the main portion.

3. The wiring structure of claim 1, wherein a width of the second portion is greater than a width of the first portion to form the extending portion.

4. The wiring structure of claim 1, wherein the extending portion is disposed on a surface of the upper dielectric layer.

5. The wiring structure of claim 1, wherein a tapering direction of the unit portion is same as a tapering direction of the inner conductive via.

6. The wiring structure of claim 1, wherein the conductive through via is disposed in an accommodating hole formed from a plurality of stacked via portions.

7. The wiring structure of claim 1, wherein a lattice of a conductive material of the conductive through via is different form a lattice of a conductive material of the circuit layer.

8. The wiring structure of claim 1, wherein a grain size of a conductive material of the conductive through via is greater than a grain size of a conductive material of the circuit layer.

9. The wiring structure of claim 1, wherein a maximum width of the conductive through via is less than or equal to 20 μm.

10. The wiring structure of claim 1, further comprising:
    a substrate structure including at least one dielectric layer and at least one circuit layer in contact with the dielectric layer; and
    an intermediate layer disposed between the conductive structure and the substrate structure and bonding the conductive structure and the substrate structure together, wherein the conductive through via further extends through the intermediate layer.

11. A wiring structure, comprising:

a lower conductive structure including at least one dielectric layer and at least one circuit layer in contact with the dielectric layer;

an upper conductive structure disposed on the lower conductive structure, wherein the upper conductive structure includes a plurality of dielectric layers and a plurality of circuit layers in contact with the dielectric layers; and at least one conductive through via extending through the upper conductive structure, wherein the conductive through via is a monolithic structure and includes a main portion and an extending portion protruding from the main portion;

wherein the conductive through via further includes a plurality of unit portions embedded in a respective one of the dielectric layers and a lower portion extending from the unit portion most adjacent to the lower conductive structure, wherein the lower portion contacts the circuit layer of the lower conductive structure, and includes a curved sidewall;

wherein the unit portion most adjacent to the lower conductive structure further includes a first portion embedded in an upper dielectric layer and a second portion embedded in a lower dielectric layer under the upper dielectric layer, and the lower portion extends from a bottom surface of the second portion to a top surface of the circuit layer of the lower conductive structure; wherein a height of the lower portion is greater than a thickness of the second portion; wherein the curved sidewall of the lower portion includes a first portion in the lower dielectric layer, and the first portion of the curved sidewall curves toward the lower dielectric layer; wherein an included angle between the first portion of the curved sidewall and the bottom surface of the second portion includes an acute angle in a cross-sectional view.

12. The wiring structure of claim 11, further comprising an intermediate layer disposed between the upper conductive structure and the lower conductive structure and bonding the upper conductive structure and the lower conductive structure together, wherein the curved sidewall of the lower portion further includes a second portion under the first portion and in the intermediate layer, and the second portion of the curved sidewall curves toward the intermediate layer.

13. The wiring structure of claim 12, wherein an included angle between the second portion of the curved sidewall and the top surface of the circuit layer of the lower conductive structure includes an acute angle in a cross-sectional view.

14. The wiring structure of claim 13, wherein the lower portion includes a first portion in the lower dielectric layer, and a width of the first portion gradually increases toward the lower conductive structure.

15. The wiring structure of claim 14, wherein the lower portion further includes a second portion in the intermediate layer, and a width of the second portion gradually decreases toward the lower conductive structure.

16. The wiring structure of claim 15, wherein the height of the lower portion is greater than a thickness of the circuit layer of the upper conductive structure.

* * * * *